(12) United States Patent
Arai et al.

(10) Patent No.: US 7,508,067 B2
(45) Date of Patent: Mar. 24, 2009

(54) SEMICONDUCTOR INSULATION STRUCTURE

(75) Inventors: Hiroaki Arai, Nagoya (JP); Takahiro Ogawa, Aichi-ken (JP); Mitsuhara Inagaki, Nishio (JP)

(73) Assignee: Denso Corporation, Kariya (JP)

( * ) Notice: Subject to any disclaimer, the term of this patent is extended or adjusted under 35 U.S.C. 154(b) by 127 days.

(21) Appl. No.: 11/546,976

(22) Filed: Oct. 13, 2006

(65) Prior Publication Data

US 2007/0085197 A1    Apr. 19, 2007

(30) Foreign Application Priority Data

Oct. 13, 2005  (JP) .............................. 2005-298758
Oct. 13, 2005  (JP) .............................. 2005-298759

(51) Int. Cl.
*H01L 23/34*   (2006.01)
*H01L 23/10*   (2006.01)

(52) U.S. Cl. ..................... 257/719; 257/706; 257/713; 257/701; 257/E23.101

(58) Field of Classification Search ................. 257/719, 257/706, 713, E23.101, 701
See application file for complete search history.

(56) References Cited

U.S. PATENT DOCUMENTS

| | | | |
|---|---|---|---|
| 6,542,365 B2 | 4/2003 | Inoue | |
| 6,845,012 B2 | 1/2005 | Ohkouchi | |
| 6,917,103 B2 | 7/2005 | Hirano et al. | |
| 7,027,302 B2 | 4/2006 | Inoue | |
| 2003/0094682 A1* | 5/2003 | Shinohara et al. | ............ 257/685 |
| 2004/0089941 A1* | 5/2004 | Mamitsu et al. | ............. 257/718 |
| 2004/0183188 A1* | 9/2004 | Oohama | ...................... 257/706 |
| 2004/0195649 A1 | 10/2004 | Miura et al. | |
| 2005/0040515 A1 | 2/2005 | Inoue et al. | |
| 2006/0120047 A1 | 6/2006 | Inoue | |
| 2007/0035937 A1* | 2/2007 | Colbert et al. | ............... 361/810 |

FOREIGN PATENT DOCUMENTS

| | | |
|---|---|---|
| JP | 2001-320005 | 11/2001 |
| JP | 2001-352023 | 12/2001 |
| JP | 2003-258166 | 9/2003 |
| JP | 2004-296588 | 10/2004 |

OTHER PUBLICATIONS

US 6,787,898, 09/2004, Hirano et al. (withdrawn)

* cited by examiner

*Primary Examiner*—Nitin Parekh
(74) *Attorney, Agent, or Firm*—Nixon & Vanderhye PC

(57) ABSTRACT

A semiconductor insulation structure is disclosed for a semiconductor module, incorporating therein a semiconductor element, with which an electrically conductive structural body is held in pressured contact via an intervening insulation member. The semiconductor insulation structure includes a deformation preventing structure to avoid the insulation member from deforming when applied with load thereto. In one aspect, the deformation preventing structure includes a deformation resistant abutment surface, formed on the semiconductor module, and a readily deforming abutment surface formed on the electrically conductive structural body. In another aspect, the deformation preventing structure includes a reinforcement formed on a cooler and held in contact with the insulation member in an area placed in opposition to an outer circumferential periphery of the semiconductor module.

4 Claims, 13 Drawing Sheets

SEMICONDUCTOR INSULATION STRUCTURE

CROSS REFERENCE TO RELATED APPLICATIONS

This application is related to Japanese Patent Application Nos. 2005-298758 and 2005-298759 filed on Oct. 13, 2005, respectively, the contents of which are hereby incorporated by reference.

BACKGROUND OF THE INVENTION

1. Technical Field of the Invention

The present invention relates to semiconductor insulation structures for cooling semiconductor modules incorporating semiconductor elements and, more particularly, to a semiconductor insulation structure for a semiconductor module, incorporating a semiconductor module herein, an insulation member and an electrically conductive structural body all of which are held in pressured contact with each other 2. Description of the Related Art In the related art, attempt has heretofore been made to provide a semiconductor insulation structure such as a structure shown in FIGS. 22 and 23 (see Japanese Patent Laid-Open Publication No. 2001-320005, US2005/0040515A1 and US012006/1020047A1). With such a structure, radiator plates 950, 950 sandwich a semiconductor element 91, incorporated in a semiconductor module 9, and coolers 7, 7 are mounted on the radiator plates 950, 950, respectively, with the semiconductor element 9, the radiator plates 8, 8 and the coolers 7, 7 being held in pressured contact with each other for cooling the semiconductor module 9. The semiconductor module 9 further includes insulation members 8 each composed of ceramic material and interposed between the cooler 7 and the radiator plate 950, exposed to a surface of the semiconductor module 9, to ensure electrically insulating property therebetween.

However, under circumstances where the radiator plates 950, 950 are made of copper and the coolers 7, 7 are made of aluminum, if the coolers 7, 7 and the radiator plates 950, 950 are pressurized against each other with the intervening insulation members 8, 8, the coolers 7, 7 are liable to deform with greater extents than those of the radiator plates 950, 950 when applied with a given rate of load. When this takes place, bending forces act on the insulation members 8, 8 to cause the deformations thereof due to the deformations of the coolers 7, 7. This result in the occurrence of fears for the insulation members 8, 8 to undergo crack or damages. Thus, difficulties are encountered in ensuring electrically insulating property between the semiconductor module 9 and the coolers 7, 7.

With such a structure, when the radiator plate 950, having a less deformation rate in terms of a given load, is brought into abutting engagement with a surface of each cooler 7 that has a high deformation rate in terms of the given load, stress concentration occurs on an abutment portion between the radiator plate 950 and the cooler 7. When this takes place, the cooler 7 deforms in the abutment portion at an area in the vicinity of an outer circumferential periphery 951 of the radiator plate 950. That is, under the circumstances where the radiator plates 950, 950 have the less deformation rates in terms of the given load than those of the coolers 7, 7, the presence of the outer circumferential periphery 951 remaining inward of an outer circumferential periphery 751 of the cooler 7 tends to cause the cooler to deform in a manner mentioned above. Thus, deterioration occurs in electrically insulating property between the semiconductor module 9 and the cooler 7.

SUMMARY OF THE INVENTION

The present invention has been completed with a view to addressing the above issues and has an object to provide a semiconductor insulation structure that can effectively prevent deterioration in electrically insulating property between a semiconductor module and an electrically conductive structural body mounted thereon without causing damage to an insulation member.

To achieve the above object, one aspect of the present invention provides a semiconductor insulation structure comprising a semiconductor module incorporating therein a semiconductor element and having one surface serving as a first abutment surface, and an insulation member having one surface held in contact with the first abutment surface of the semiconductor module. An electrically conductive structural body having a second abutment surface is held in contact with the other surface of the insulation member so as to sandwich the same between the electrically conductive structural body and the semiconductor module. The semiconductor module, the insulation member and the electrically conductive structural body are held in pressured contact with each other. One of the first and second abutment surfaces is made of material to provide a deformation resistant abutment surface with a less deformation rate in terms of a given load and the other one of the first and second abutment surfaces is made of material to provide a readily deforming abutment surface with a greater deformation rate in terms of the given load than that of the one of the first and second abutment surfaces. At least a portion of an outer circumferential periphery of the deformation resistant abutment surface is placed outside an outer circumferential periphery of the readily deforming abutment surface.

With the semiconductor insulation structure of such a structure, at least the portion of the outer circumferential periphery of the deformation resistant abutment surface is placed outside the outer circumferential periphery of the readily deforming abutment surface. Therefore, no stress concentration takes place on an area where the deformation resistant abutment surface is placed outside the outer circumferential periphery of the readily deforming abutment surface, thereby precluding the deformation of the readily deforming abutment surface in a highly reliable fashion. Accordingly, no bending force acts on the insulation member, thereby preventing damage to the insulation member. This prevents deterioration in electrically insulating property between the semiconductor module and the electrically conductive structural body.

With the semiconductor insulation structure mentioned above, the deformation resistant abutment surface may have corners all of which are placed outside the outer circumferential periphery of the readily deforming abutment surface.

With such a structure, the placement of the corners of the deformation resistant abutment surface in an area outside the outer circumferential periphery of the readily deforming abutment surface provides further increased reliability in preventing damage to the insulation member to ensure electrically insulating property between the semiconductor module and the electrically conductive structural body.

With the semiconductor insulation structure mentioned above, the deformation resistant abutment surface may have an outer circumferential periphery a whole of which is placed outside the outer circumferential periphery of the readily deforming abutment surface.

With such a structure, the placement of a whole of the outer circumferential periphery of the deformation resistant abutment surface in an area outside the outer circumferential periphery of the readily deforming abutment surface provides further increased reliability in preventing damage to the insulation member to ensure electrically insulating property between the semiconductor module and the electrically conductive structural body.

With the semiconductor insulation structure mentioned above, the electrically conductive structural body may comprise a cooler for cooling the semiconductor module.

With such a structure, since the electrically conductive structural body comprises the cooler, the semiconductor module can be effectively cooled with the resultant increase in operating life of the semiconductor element.

With the semiconductor insulation structure mentioned above, the semiconductor module may have the deformation resistant abutment surface and the electrically conductive structural body has the readily deforming abutment surface.

With such a structure, the provision of the semiconductor module having the deformation resistant abutment surface and the electrically conductive structural body having the readily deforming abutment surface allows the deformation resistant abutment surface of the semiconductor module prevents the deformation of the electrically conductive structural body. This provides a structure that has high reliability in preventing damage to the insulation member.

With the semiconductor insulation structure mentioned above, the electrically conductive structural body may be internally formed with a coolant flow passageway for admitting the flow of coolant medium therethrough and the outer circumferential periphery of the deformation resistant abutment surface of the semiconductor module may be placed outside the outer circumferential periphery of the readily deforming abutment surface of the electrically conductive structural body in a direction perpendicular to a direction in which the coolant flow passageway extends.

With such a structure, the provision of the electrically conductive structural body formed with the coolant flow passageway results in an increase in cooling efficiency of the semiconductor module, while making it possible to easily perform placement between the semiconductor module and the electrically conductive structural body.

With the semiconductor insulation structure mentioned above, the insulation member may comprise an insulation film tightly fitted to at least one of the deformation resistant abutment surface and the readily deforming abutment surface.

With such a structure, the use of the insulation film as the insulation member enables the semiconductor module to have an insulation structure with high reliability.

With the semiconductor insulation structure mentioned above, the semiconductor module may comprise a radiator plate held in contact with the semiconductor element and interposed between the semiconductor element and the insulation member in tight contact therewith for radiating heat from the semiconductor element to the electrically conductive structural body, wherein the radiator plate has the deformation resistant abutment surface, held in pressured contact with the insulation member, which has an outer circumferential periphery placed outside the outer circumferential periphery of the readily deforming abutment surface of the electrically conductive structural body.

With such a structure, the provision of the semiconductor module having the radiator plate held in contact with the semiconductor element and having the deformation resistant abutment surface and the electrically conductive structural body having the readily deforming abutment surface provides an increase in cooling efficiency of the semiconductor element while allowing the deformation resistant abutment surface of the radiator plate to prevent the deformation of the electrically conductive structural body. This provides a structure that has improved cooling efficiency and high reliability in preventing damage to the insulation member.

With the semiconductor insulation structure mentioned above, the electrically conductive structural body may comprise a cooler that has a plurality of coolant flow passageways for admitting the flow of coolant medium therethrough for cooling the semiconductor element via the insulation member. The semiconductor module may comprise a radiator plate placed in contact with the semiconductor element and interposed between the semiconductor element and the insulation member in tight contact therewith for radiating heat from the semiconductor element. The radiator plate may have the deformation resistant abutment surface, held in pressured contact with the insulation member, which has an outer circumferential periphery placed outside the outer circumferential periphery of the readily deforming abutment surface of the electrically conductive structural body.

With such a structure, the provision of the radiator plate held in contact with the semiconductor element in combination with the cooler having a plurality of coolant flow passageways results in a further increase in cooling efficiency of the semiconductor element. Also, the use of the radiator plate having the deformation resistant abutment surface whose outer circumferential periphery is placed outside the outer circumferential periphery of the readily deforming abutment surface of the electrically conductive structural body enables the prevention of damage to the insulation member in a highly reliable manner. This prevents deterioration in electrically insulating property between the electrically conductive structural body and the semiconductor module.

With the semiconductor insulation structure mentioned above, the insulation member may have an outer peripheral portion surrounding an outer periphery of the radiator plate at a partial area thereof.

With such a structure, the electrically conductive structural body and the insulation member can be preassembled in a unitary structure, under which the unitary structure can be assembled with remaining component parts in an easy fashion, providing improved assembling workability.

With the semiconductor insulation structure mentioned above, the insulation member may comprise an insulation film surrounding an outer periphery of the cooler.

With such a structure, the use of the insulation member surrounding the outer periphery of the cooler results in improved assembling workability of the semiconductor insulation structure.

Another aspect of the present invention provides a semiconductor insulation structure comprising a semiconductor module including a semiconductor element and a radiator plate held in contact with the semiconductor element to radiate heat therefrom, an insulation member placed on the radiator plate of the semiconductor module, and an electrically conductive structural body held in contact with the insulation member, with the semiconductor element, the radiator plate, the insulation member and the electrically conductive structural body being held in pressured contact with each other. The radiator plate has a deformation resistant abutment surface, facing the electrically conductive structural body, which has a less deformation rate in terms of a given load and the electrically conductive structural body has a readily deforming abutment surface, facing the deformation resistant abutment surface of the radiator plate, which has a greater deformation rate in terms of the given load than that of the radiator plate. At least a portion of an outer circumferential periphery of the deformation resistant abutment surface of the radiator plate is placed outside an outer circumferential periphery of the readily deforming abutment surface of the electrically conductive structural body.

Another aspect of the present invention provides a semiconductor insulation structure comprising a semiconductor module including a semiconductor element and a pair of radiator plates between which the semiconductor element is sandwiched to radiate heat therefrom, a pair of insulation members placed on the pair of radiator plates of the semiconductor module, and a pair of electrically conductive structural bodies held in contact with the pair of insulation members, respectively, with the semiconductor element, the radiator plates, the insulation members and the electrically conductive structural bodies being held in pressured contact with each other. Each of the radiator plates has a deformation resistant abutment surface, facing each of the electrically conductive structural bodies, which has a less deformation rate in terms of a given load and each of the electrically conductive structural bodies has a readily deforming abutment surface, facing the deformation resistant abutment surface of each radiator plate, which has a greater deformation rate in terms of the given load than that of each radiator plate. At least a portion of an outer circumferential periphery of the deformation resistant abutment surface of each radiator plate is placed outside an outer circumferential periphery of the readily deforming abutment surface of each electrically conductive structural body.

With such a structure, the semiconductor module can be cooled on both sides, resulting in an increase in cooling efficiency. Further, no stress concentration takes place on an abutment area between the deformation resistant abutment surface of each radiator plate and the readily deforming abutment surface of each electrically conductive structural body. This provides a further increase in reliability in preventing damage to the insulation member.

With the semiconductor insulation structure stated above, each of the pair of coolers may have a plurality of coolant flow passageways for admitting the flow of coolant medium therethrough for cooling the semiconductor element via each of the insulation members. Each of the pair of coolers may include a protruding portion having the readily deforming abutment surface held in contact with each of the insulation members at an area inside the outer circumferential periphery of the deformation resistant abutment surface of each radiator plate.

With such a structure, the provision of the protruding portion formed on each cooler allows the deformation resistant abutment surface of each radiator plate to be held in contact with each of the insulation members at an area outside the outer circumferential periphery of the readily deforming abutment surface of the cooler. This results in an increase in reliability in preventing damage to each insulation member, thereby effecting the prevention of deterioration of the electrical insulation property between the semiconductor module and the cooler.

Another aspect of the present invention provides a semiconductor insulation structure comprising a semiconductor module incorporating therein a semiconductor element and having an abutment surface, an insulation member placed in contact with the abutment surface of the semiconductor module, and a cooler having an abutment surface held in contact with the insulation member in opposition to the abutment surface of the semiconductor module so as to sandwich the insulation member between the cooler and the semiconductor module, wherein the semiconductor module, the insulation member and the cooler are held in pressured contact with each other. The cooler includes an area formed with a reinforcement, held in contact with the insulation member in an area placed in opposition to an outer circumferential periphery of the abutment surface of the semiconductor module, which has a less deformation rate than that of another area of the cooler appearing when applied with a given load in a direction perpendicular to the abutment surface of the cooler.

With such a structure, since the cooler has an area, held in contact with the insulation member, which has the reinforcement with a less deformation rate than that of another area of the cooler appearing when applied with a given load in a direction perpendicular to the abutment surface of the cooler, the deformation of the cooler is effectively minimized. Therefore, no bending force acts on the insulation member, avoiding damage to the insulation member. This results in an effect of preventing deterioration in electrically insulating property between the cooler and the semiconductor module.

With the semiconductor insulation structure set forth above, the reinforcement may have a higher Young's modulus than that of another area of the cooler.

With such a structure, the abutment surface of the cooler has an area, liable to bear stress concentration, which has the higher Young's modulus than that of another area of the cooler. Therefore, in using the cooler under a status where a force acts on such an area in an elastic range, the deformation of the cooler can be effectively minimized. This allows bending force acting on the insulation member to be minimized, thereby preventing damage to the insulation member. Thus, no deterioration takes place in electrically insulating property between the semiconductor module and the cooler.

With the semiconductor insulation structure set forth above, the reinforcement may have higher tension strength than that of another area of the cooler.

With such a structure, of the abutment surface of the cooler, an area susceptible to stress concentration has increased tension strength. Therefore, in using the cooler under the status where the force acts on such an area in the elastic range, the deformation of the cooler can be effectively minimized. This allows bending force acting on the insulation member to be minimized, thereby preventing damage to the insulation member in an effective manner. Thus, no deterioration takes place in electrically insulating property between the semiconductor module and the cooler.

With the semiconductor insulation structure set forth above, the reinforcement may have a higher yield stress than that of another area of the cooler.

With such a structure, of the abutment surface of the cooler, an area susceptible to stress concentration has the higher yield stress than that of another area of the cooler. Therefore, in using the cooler under the status where the force acts on such an area in the elastic range, the deformation of the cooler can be effectively minimized. This allows bending force acting on the insulation member to be minimized, thereby preventing damage to the insulation member in an effective manner. Thus, no deterioration takes place in electrically insulating property between the semiconductor module and the cooler.

With the semiconductor insulation structure set forth above, the reinforcement may have a higher rigidity than that of another area of the cooler.

With such a structure, of the abutment surface of the cooler, an area susceptible to stress concentration has the higher rigidity (given by multiplying Young's modulus by geometrical moment of inertia) than that of another area of the cooler. Therefore, in using the cooler under the status where the force acts on such an area in the elastic range, the deformation of the cooler can be effectively minimized. This allows bending force acting on the insulation member to be minimized, thereby preventing damage to the insulation member in an effective manner. Thus, no deterioration takes place in electrically insulating property between the semiconductor module and the cooler.

With the semiconductor insulation structure set forth above, the cooler may have a plurality of coolant flow passageways to internally flow coolant medium.

With such a structure, the use of coolant medium admitted to the plurality of coolant flow passageways results in an increase in a cooling efficiency of the semiconductor module.

With the semiconductor insulation structure set forth above, the reinforcement may have a greater thickness than that of another area of the cooler.

With such a structure, the reinforcement can have an increased rigidity, resulting in a reliability of preventing damage to the insulation member.

With the semiconductor insulation structure set forth above, the plurality of coolant flow passageways may include first and second flow passageways with each of the second flow passageways having a narrower flow width than that of each of the first flow passageways for thereby permitting the cooler to have the reinforcement.

With such a structure, the reinforcement can have an increased rigidity, resulting in a reliability of preventing damage to the insulation member.

That is, as the coolant flow passageway has an increased flow width, a cavity inside of the cooler increases, resulting in a drop in rigidity of the cooler. Therefore, permitting the reinforcement to include a decreased flow width of the coolant flow passageway enables an increase in rigidity of the reinforcement.

With the semiconductor insulation structure set forth above, the plurality of coolant flow passageways may include first and second flow passageways with each of the second flow passageways having a partition wall with a greater thickness than that of a partition wall of each of the first flow passageways for thereby permitting the cooler to have the reinforcement.

With such a structure, the formation of the partition wall, playing a role as a reinforcement component to bear a pressing force, which has an increased thickness enables the reinforcement to easily have increased rigidity.

With the semiconductor insulation structure set forth above, the cooler may have a central area internally formed with a plurality of coolant flow passageways and a sided area composed of a solid body by which the reinforcement is formed.

With such a structure, the provision of the solid body in the cooler provides the reinforcement with increased rigidity in a compact and simplified structure.

With such a structure, the formation of the partition wall, the insulation member may comprise an insulation film tightly fitted to at least one of the abutment surface of the cooler and the abutment surface of the semiconductor module.

A further aspect of the present invention provides a semiconductor insulation structure comprising a semiconductor module including a semiconductor element and a radiator plate held in contact with the semiconductor element to radiate heat therefrom and having an abutment surface, an insulation member placed on the abutment surface of the radiator plate of the semiconductor module, and a cooler having an abutment surface held in contact with the insulation member, with the semiconductor element, the radiator plate, the insulation member and the cooler being held in pressured contact with each other. The cooler includes an area formed with a reinforcement, held in contact with the insulation member in an area placed in opposition to an outer circumferential periphery of the abutment surface of the radiator plate, which has a less deformation rate than that of another area of the cooler appearing when applied with a given load in a direction perpendicular to the abutment surface of the cooler.

With such a structure, since the cooler has an area, held in contact with the insulation member, which has the reinforcement with a less deformation rate than that of another area of the cooler appearing when applied with a given load in a direction perpendicular to the abutment surface of the cooler, the deformation of the cooler is effectively minimized. Therefore, bending force acting on the insulation member can be minimized, avoiding damage to the insulation member. This prevents deterioration in electrically insulating property between the cooler and the semiconductor module.

A further aspect of the present invention provides a semiconductor insulation structure comprising a semiconductor module including a semiconductor element and a pair of radiator plates between which the semiconductor element is sandwiched to radiate heat therefrom, each of the radiator plates having an abutment surface, a pair of insulation members placed on the abutment surfaces of the pair of radiator plates of the semiconductor module, respectively, and a pair of coolers held in contact with the pair of insulation members, respectively, with the semiconductor element, the radiator plates, the insulation members and the coolers being held in pressured contact with each other. Each of the coolers includes an area formed with a reinforcement, held in contact with each of the insulation members in an area placed in opposition to an outer circumferential periphery of the abutment surface of each of the radiator plates, which has a less deformation rate than that of another area of each of the coolers during deformation when applied with a given load in a direction perpendicular to the abutment surface of each of the coolers.

With such a structure, the semiconductor module can be cooled on both sides, resulting in an increase in cooling efficiency. Further, no stress concentration takes place on each of the cooler. This provides a further increase in reliability in preventing damage to each of the insulation members.

With the semiconductor insulation structure mentioned above, each of the pair of coolers may be of a drawn-cup structure and includes a pair of outer shell plates, an intermediate plate disposed between the outer shell plates to define first and second compartments, and first and second inner fins disposed in the first and second compartments, respectively. One of the outer shells includes the reinforcement held in contact with each of the insulation members.

With such a structure, the use of the cooler formed in the drawn-cup structure results in a thin and compact structure of the semiconductor insulation structure. Also, the drawn-cup structure enables the cooling fins to be densely placed, resulting in an increase in cooling efficiency of the semiconductor module.

With the semiconductor insulation structure mentioned above, the first and second inner fins may have coarsely corrugated sections with low corrugation density and densely corrugated sections with high corrugation density with which the reinforcement of each of the coolers is formed.

With such a structure, the use of the first and second inner fins having coarsely corrugated sections with low corrugation density and densely corrugated sections with high corrugation density enables the semiconductor module to be formed in a simplified structure with less number of component parts. Also, the semiconductor module can be cooled with increased cooling efficiency. Moreover, the provision of the coolers each provided with the reinforcement results in effect of preventing damage to the insulation member to ensure increased electrically insulating property.

A further aspect of the present invention provides a semiconductor insulation structure comprising a semiconductor module incorporating therein a semiconductor element, an insulation member held in contact with the semiconductor module, and an electrically conductive structural body held in contact with the insulation member so as to sandwich the same between the electrically conductive structural body and the semiconductor module. The semiconductor module, the insulation member and the electrically conductive structural body are held in pressured contact with each other. A deformation preventing structure is associated with at least one of the electrically conductive structural body and the semiconductor module for protecting the insulation member from being deformed when applied with an external force thereto.

With such a structure, the use of the deformation preventing structure associated with at least one of the electrically conductive structural body and the semiconductor module enables the semiconductor insulation structure to be formed in a simplified structure with less number of component parts. This results in a reduction in cost. Also, the provision of the deformation preventing structure enables the prevention of damage to the insulation member, thereby avoiding deterioration in an electrically insulating property between the electrically conductive structural body and the semiconductor module.

With the semiconductor insulation structure set forth above, the deformation preventing structure may comprise deformation resistant abutment section disposed on one of the semiconductor modules and the electrically conductive structural body and having a less deformation rate in terms of a given load, and readily deforming abutment section disposed on the other one of the semiconductor modules and the electrically conductive structural body and having a greater deformation rate in terms of the given load than that of the deformation resistant abutment section. At least a portion of an outer circumferential periphery of the deformation resistant abutment section is placed outside an outer circumferential periphery of the readily deforming abutment section.

With such a structure, since the deformation preventing structure takes the form of the deformation resistant abutment section and the readily deforming abutment section associated with the semiconductor module and the electrically conductive structural body, the semiconductor insulation structure can be manufactured in a simple and compact structure with less number of component parts.

With the semiconductor insulation structure set forth above, the deformation preventing structure may comprise reinforcement means disposed in the electrically conductive structural body on a side facing the insulation member.

With such a structure, the deformation preventing structure takes the form of the reinforcement means disposed in the electrically conductive structural body. This results in a simplified structure of the semiconductor. Also, the deformation preventing structure effectively prevents damage to the insulation member, ensuring electrically insulating property.

DETAILED DESCRIPTION OF PREFERRED EMBODIMENTS

Figure 1:
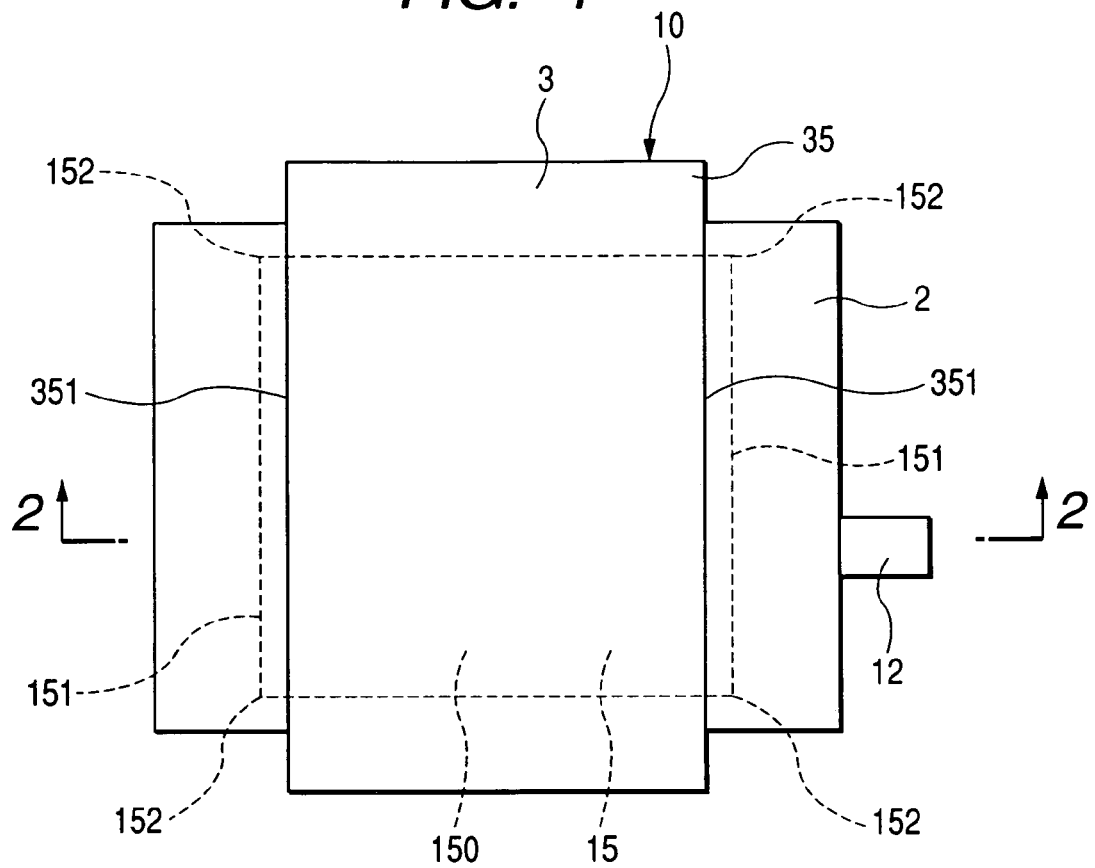
FIG. 1 is a plan view of a semiconductor insulation structure of a first embodiment according to the present invention.

Semiconductor insulation structures of various embodiments according to the present invention are described below in detail with reference to the accompanying drawings.

With the present invention, a semiconductor module may incorporate semiconductor elements such as, for instance, a MOS type FET element, an IGBT element, a diode, a transistor, a thyristor, a power integrated circuit, etc.

Further, an insulation material, incorporated in the semiconductor module, may include a ceramic plate or the like having excellent conductance. Also, the insulation material may have a thickness with a value ranging from, for instance, 0.1 to 1.0 mm.

Furthermore, an electrically conductive structural body may include, in addition to a cooler described below, a heat sink, a case and other electronic components or the like.

First Embodiment

A semiconductor insulation structure of a first embodiment according to the present invention is described below with reference to FIGS. 1 and 2 of the accompanying drawings.

The semiconductor insulation structure 10 is comprised of a semiconductor module 1 incorporating therein a semiconductor element 11, an insulation member 2 placed in contact with the semiconductor module 1, and a cooler 3, placed in contact with the insulation member 2 so as to sandwich the insulation member 2 between the semiconductor module 1 and the cooler 3, which plays a role as an electrically conductive structural body.

With the present embodiment, the semiconductor insulation structure 10 further includes a deformation preventing structure 20 associated with at least one of the electrically conductive structural body 3 and the semiconductor module 1 for protecting the insulation member 2 from being deformed when applied with an external force thereto. More particularly, the deformation preventing structure 20 comprises a deformation resistant abutment section 15 provided on one of the semiconductor module 1 and the electrically conductive structural body 3 and having a less deformation rate in terms of a given load, and a readily deforming abutment section 35 provided on the other one of the semiconductor module 1 and the electrically conductive structural body 3 and having a greater deformation rate in terms of the given load than that of the deformation resistant abutment section. Further, least a portion of an outer circumferential periphery of the deformation resistant abutment section is placed outside an outer circumferential periphery of the readily deforming abutment section.

That is, of an abutment surface of the semiconductor module 1, placed in opposition to the insulation member 2 to sandwich the same, and an abutment surface of the cooler 3, either one of the abutment surface includes a deformation resistant abutment surface 15 made of a material that is deformable in a less extent upon receipt of a given load and the other one includes a readily deforming abutment surface 35 made of a material that is deformable in an increased extent upon receipt of the given load.

With the present embodiment, the semiconductor module 1 has the deformation resistant abutment surface 15 facing one surface of the insulation member 2 and the cooler 3 has the readily deforming abutment surface 35 facing the other surface of the insulation member 2.

The deformation resistant abutment surface 15 has an outer circumferential periphery 151 at least one of which is placed outside an outer circumferential periphery 351 of the readily deforming abutment surface 35.

In addition, as shown in FIG. 1, the deformation resistant abutment surface 15 is formed in a rectangular shape. Also, all corners 152 of the deformation resistant abutment surface 15 are placed outside the outer circumferential periphery 351 of the readily deforming abutment surface 35.

The readily deforming abutment surface 35 of the cooler 3 is made of aluminum and the deformation resistant abutment surface 15 of the semiconductor module 1 is made of copper.

Also, the deformation resistant abutment surface 15 may take the form of a structure made of different materials provided that they are formed in a coplanar surface. For instance, like a molded material formed around a copper area, the coplanar surface may be formed using different kinds of materials to form the deformation resistant abutment surface 15.

In actual practice, the semiconductor module 1 carries thereon a radiator plate 150 that is formed with the deformation resistant abutment surface 15 placed in face-to-face relationship with the one surface of the insulation member 2. The semiconductor module 1 has a central area having a recessed portion 1a accommodating therein a semiconductor element 11. The semiconductor element 11 has one surface placed in contact with a bottom wall of the recessed portion 1a and the other surface placed in contact with a lower surface of the radiator plate 150 for heating radiating capability. Thus, heat radiation takes place from the semiconductor element 11 to the cooler 3 through the radiator plate 150 thereby radiating heat developed in the semiconductor element 11. Also, the semiconductor module 1 has a terminal 12 connected to the semiconductor element 11 through a lead wire 11a. The semiconductor module 1 is comprised of sealing material having a cavity 13a incorporating therein the semiconductor element 11, the terminal 12 and the radiator plate 15 in a unified structure.

Further, the insulation member 2 is interposed between the radiator plate 150 of the semiconductor module 1 and the cooler 3. The insulation member 2 is disposed in such a way to cover an entire surface of the deformation resistant abutment surface 15 playing a role as a surface of the radiator plate 150. Moreover, the insulation member 2 may have a thickness with a value ranging from 0.1 to 1.0 mm.

The insulation member 2 may be made of a ceramic plate having good heat conductance. Further, the insulation member 2 may be made of a resin film formed of material such as epoxy resin, polyamide resin or silicone resin. In an alternative, the insulation member 2 may include an insulation film such as a carbon-family film formed in a deposition process, including PVD (Physical Deposition Process) or CVD (Chemical Deposition Process), a nitride aluminum film, nitride silicone film or the like.

Figure 2:
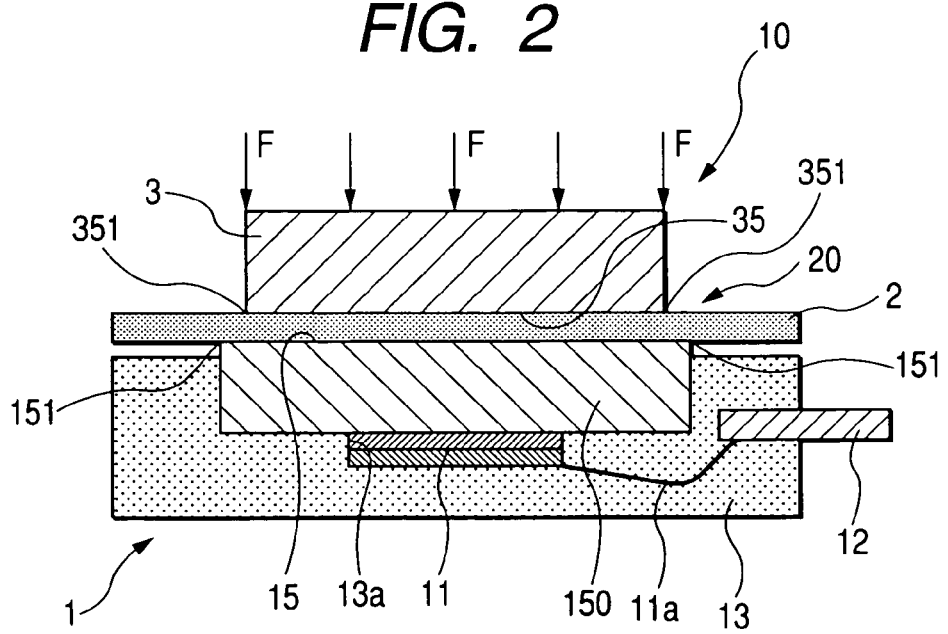
FIG. 2 is a cross-sectional view of the semiconductor insulation structure taken on line 2-2 of FIG. 1.

The semiconductor module 1 is assembled such that the cooler 3 is loaded to apply a force against the semiconductor module 1 as shown by arrows F in FIG. 2.

Furthermore, heat-radiating grease is filled in areas between the semiconductor module 1 and the insulation member 2 and between the insulation member 2 and the cooler 3, respectively. However, the semiconductor module 1 may take the form of a structure in which the semiconductor module 1 and the insulation member 2 are held in direct contact with each other and, also, the insulation member 2 and the cooler 3 are held in direct contact with each other. In an alternative, adhesive agent may be intervened between associated component parts.

Now, the operation of the semiconductor module 1 is described below in connection with advantageous effects.

As previously noted, at least a portion of the outer circumferential periphery 151 of the deformation resistant abutment surface 15 is placed in an area outside the outer circumferential periphery 351 of the readily deforming abutment surface 35. Therefore, the radiator plate 150, having the deformation resistant abutment surface 15, has at least an area, placed outside the outer circumferential periphery 351 of the readily deforming abutment surface 35, in which stress concentration is prevented. This results in capability of precluding of the readily deforming abutment surface 35 from being deformed. As a result, this enables the prevention of deterioration in electrically insulating property between the semiconductor module 1 and the cooler 3.

Further, as shown in FIG. 1, since all the corners 152 of the deformation resistant abutment surface 15 are placed outside the outer circumferential periphery 351 of the readily deforming abutment surface 35, possible damage on the insulation member 2 can be effectively prevented.

Among the outer circumferential periphery 151 of the deformation resistant abutment surface 15, if one of the corners 152 is particularly brought into contact with a surface of the readily deforming abutment surface 35, particular stress concentration is liable to occur at such a corner 152. This causes the readily deforming abutment surface 35 to deform, inviting a cause for the insulation member 2 to be damaged. To address such an issue, all of the corners 152 of the deformation resistant abutment surface 15 are placed in the areas outside the outer circumferential periphery 351 of the readily deforming abutment surface 35, effectively enabling the occurrence of damage to the insulation member 2.

Moreover, the electrically conductive structural body, placed in abutting contact with the semiconductor module 1 via the insulation member 2, is comprised of the cooler 3 that cools the semiconductor module 1. This enables the semiconductor module 1 to be effectively cooled, while providing capability of ensuring electrically insulating property between the semiconductor module 1 and the electrically conductive structural body (cooler 3).

That is, in order to adequately radiate heat from the semiconductor module 1 to the cooler 3, a need arises for the semiconductor module 1 and the cooler 3 to be adequately pressurized against each other in close contact. This results in a large pressing force being applied to the insulation member 2 between the semiconductor module 1 and the cooler 3. To avoid such pressure, applying the present invention allows stress concentration to alleviated. Thus, even if a large pressing force is applied to between the semiconductor module 1 and the cooler 3 as a whole, no damage is caused to the insulation member 2 in an effective fashion while ensuring electrically insulating property in a highly reliable manner.

Thus, a compromise can be achieved between the enhancement of a cooling efficiency of the semiconductor module 1 and the prevention of a drop in electrically insulating property.

As set forth above, the present embodiment enables the provision of the semiconductor insulation structure that enables the prevention of damage to the insulation member while adequately precluding a drop in electrically insulating property.

Second Embodiment

Figure 3:
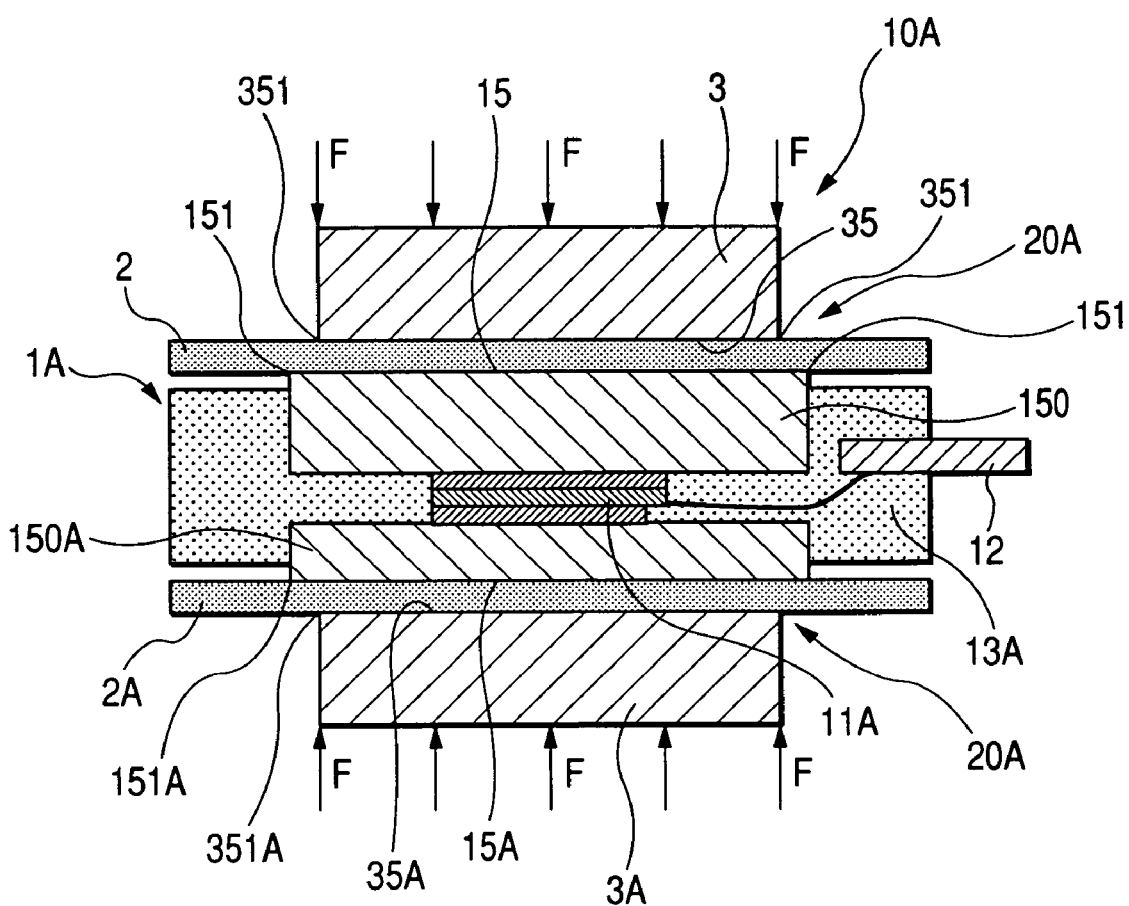
FIG. 3 is a cross-sectional view of a semiconductor insulation structure of a second embodiment according to the present invention.

A semiconductor insulation structure of a second embodiment according to the present invention is described below with reference to FIG. 3.

The semiconductor insulation structure 10A of the second embodiment differs from that of the first embodiment in respect of an insulation structure including deformation preventive structures 20A, 20A and coolers 3, 3A, each playing an electrically conductive structural body and held in pressured contact with a semiconductor module 11A via insulation members 2, 2A and, hence, a description is made with a focus on differing points.

That is, the semiconductor module 1A of the present embodiment constitutes a semiconductor module with a both-sided cooling type and has both surfaces carrying thereon radiator plates 150, 150A, respectively. Additionally, the deformation preventive structure 20A is provided between the cooler 3 and the radiator plate 150. Likewise, the deformation preventive structure 20A is also provided between the cooler 3A and the radiator plate 150A.

In particular, the radiator plates 150, 150A have the deformation resistant abutment surfaces 15, 15A, respectively, with which coolers 3, 3A are held in pressured contact via the insulation members 2, 2A, respectively.

With the semiconductor module 1A of the present embodiment mentioned above, the semiconductor module 1A has the both surfaces that are cooled, providing a further improved cooling efficiency of the semiconductor module 1A.

In addition to the above, the second embodiment has the deformation preventive structures 20A, 20A with the same advantageous effect as that of the first embodiment.

Third Embodiment

Figure 4:
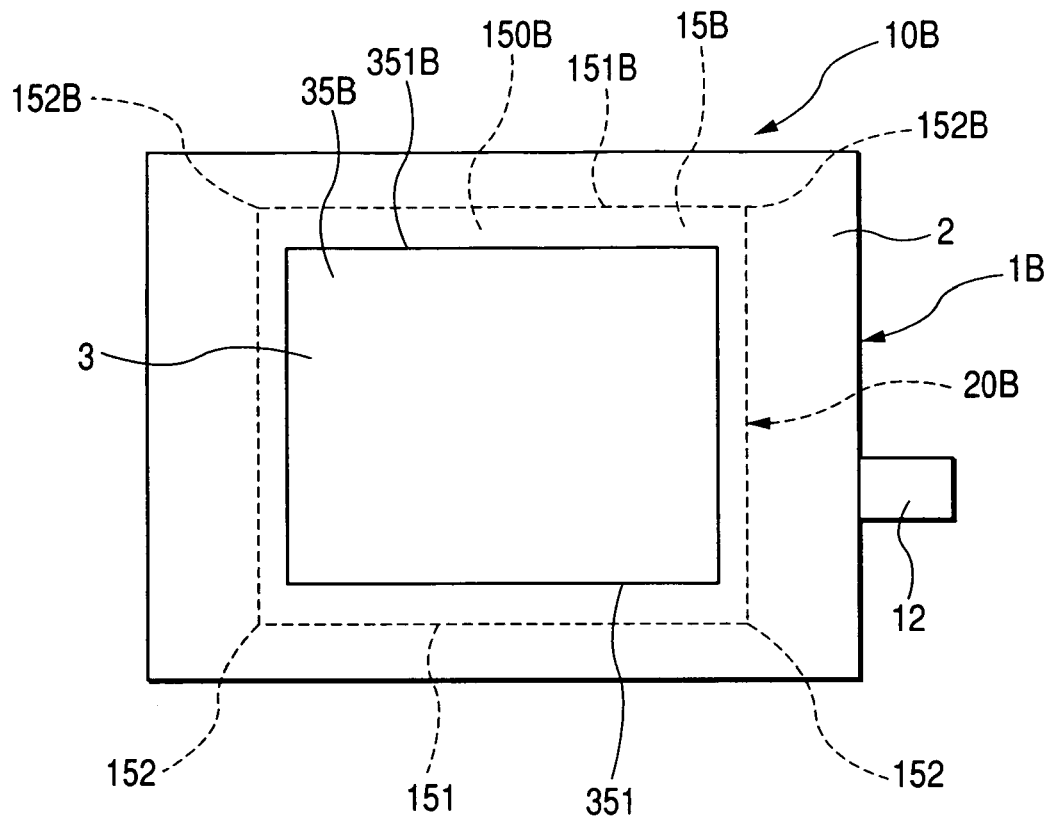
FIG. 4 is a plan view of a semiconductor insulation structure of a third embodiment according to the present invention.

A semiconductor insulation structure of a third embodiment according to the present invention is described below with reference to FIG. 4.

The semiconductor insulation structure 10B of the third embodiment differs from that of the first embodiment in that a deformation resistant abutment surface 15B of a deformation preventing structure 20B has an outer circumferential periphery 151B a whole of which is placed outside an outer circumferential periphery 351B of a readily deforming abutment surface 35B.

That is, an entire area of the outer circumferential periphery 151B of the deformation resistant abutment surface 15B, playing a role as a surface of a radiator plate 150B of a semiconductor module 1B is exposed to an area outside the readily deforming abutment surface 35B of a cooler 3 playing a role as an electrically conductive structural body. The semiconductor insulation structure 10B is similar in other structure to that of the first embodiment.

With the semiconductor module of the present embodiment, an abutment structure between the deformation resistant abutment surface 15B and the readily deforming abutment surface 35B has no area that undergoes concentrated stress, thereby effectively preventing the occurrence of damage to the insulation member 2.

In addition to the above, the structure of the present embodiment has the same advantageous effects as those of the first embodiment.

Fourth Embodiment

A semiconductor insulation structure of a fourth embodiment according to the present invention is described below with reference to FIG. 5.

The semiconductor insulation structure 10C of the fourth embodiment differs from that of the first embodiment in that a deformation preventing structure 20C is comprised of a cooler 3C, playing a role as an electrically conductive structural body, which is formed with coolant flow passages 31, 31 that permit the flow of coolant medium.

Further, a semiconductor module 1C has a deformation resistant abutment surface 15C, playing a role as part of the deformation preventing structure 20C, which has an outer circumferential periphery 151C placed outside the outer circumferential periphery 351 of the readily deforming abutment surface 35 in respect of a direction perpendicular to a direction in which the coolant flow passages 31, 31 extend.

Figure 5:
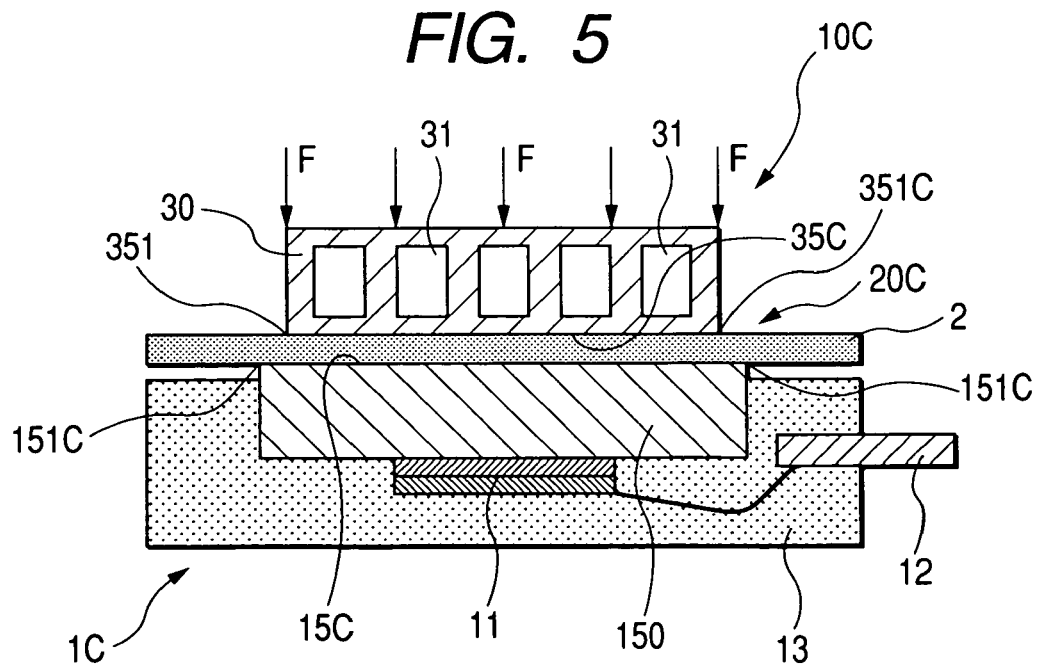
FIG. 5 is a cross-sectional view of a semiconductor insulation structure of a fourth embodiment according to the present invention.
Figure 6:
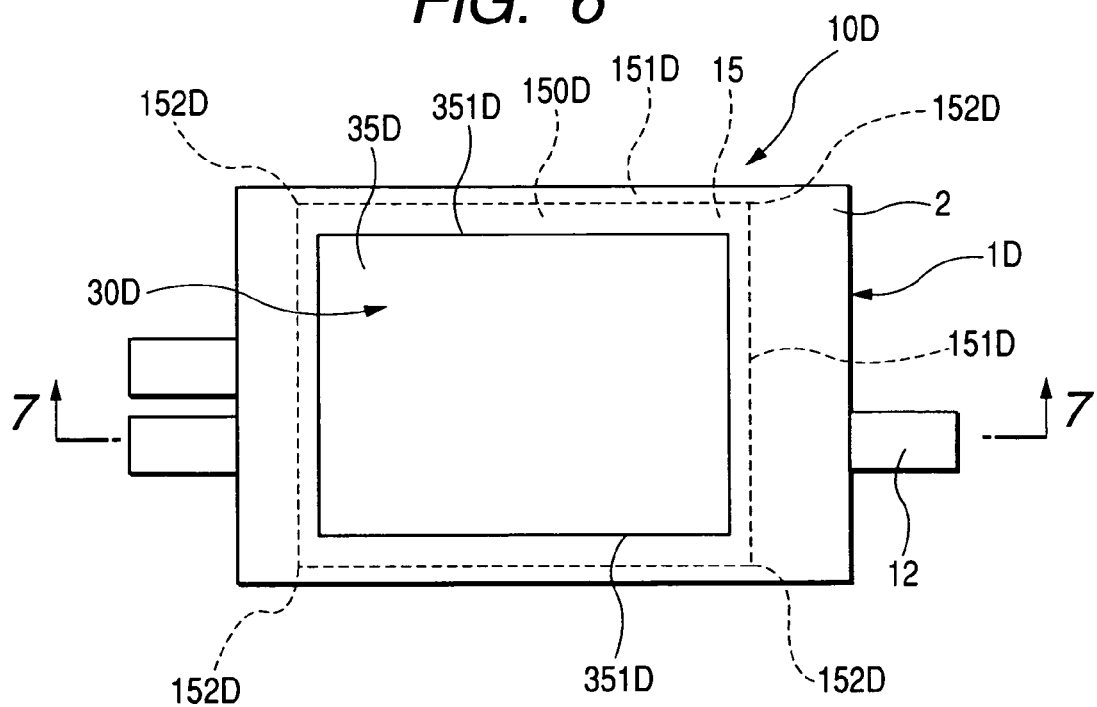
FIG. 6 is a plan view of a semiconductor insulation structure of a fifth embodiment according to the present invention.
Figure 7:
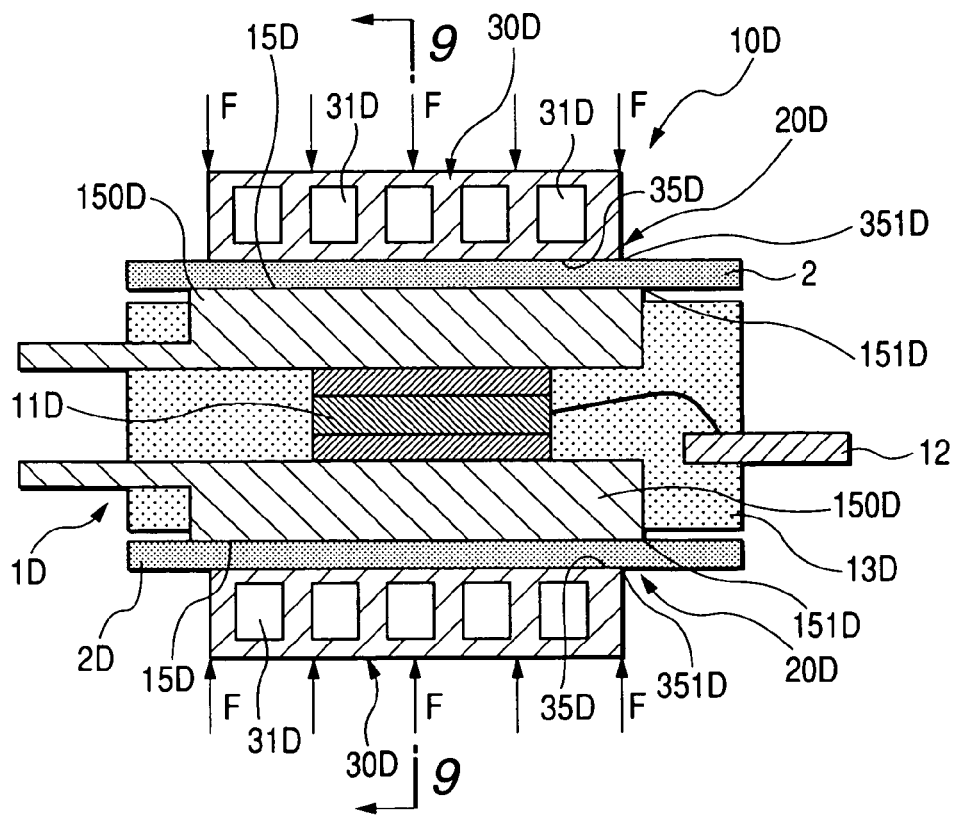
FIG. 7 is a cross-sectional view of the semiconductor insulation structure taken on line 7-7 of FIG. 6.

The term "direction in which the coolant flow passages 31, 31 extend" refers to a direction perpendicular to a paper sheet of the drawing in FIG. 5 and the term "direction perpendicular to the direction in which the coolant flow passages 31, 31 extend" refers to a lateral direction in FIG. 5.

The structure of the fourth embodiment is similar in other structure as that of the first embodiment.

With the semiconductor module of the present embodiment, a further improved cooling efficiency is obtained, while providing an ease of placement between the semiconductor module 1C and the cooler 30.

In addition to the above, the structure of the present embodiment has the same advantageous effects as those of the first embodiment.

Fifth Embodiment

A semiconductor insulation structure of a fifth embodiment according to the present invention is described below with reference to FIGS. 6 to 9.

Figure 8:
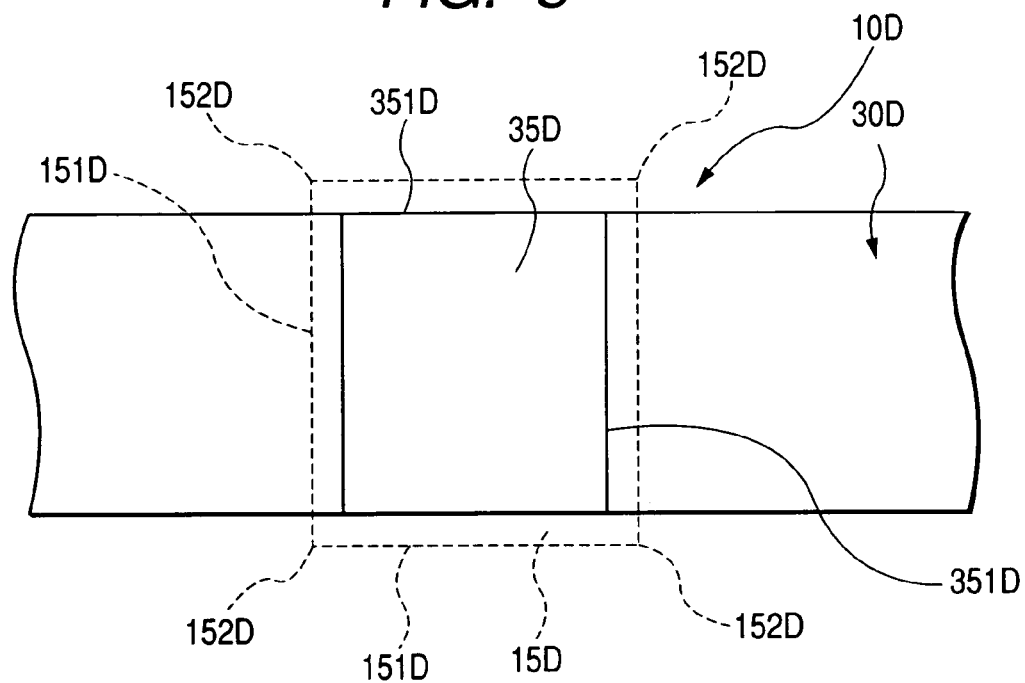
FIG. 8 is a plan view of a semiconductor insulation structure of a fifth embodiment according to the present invention.
Figure 9:
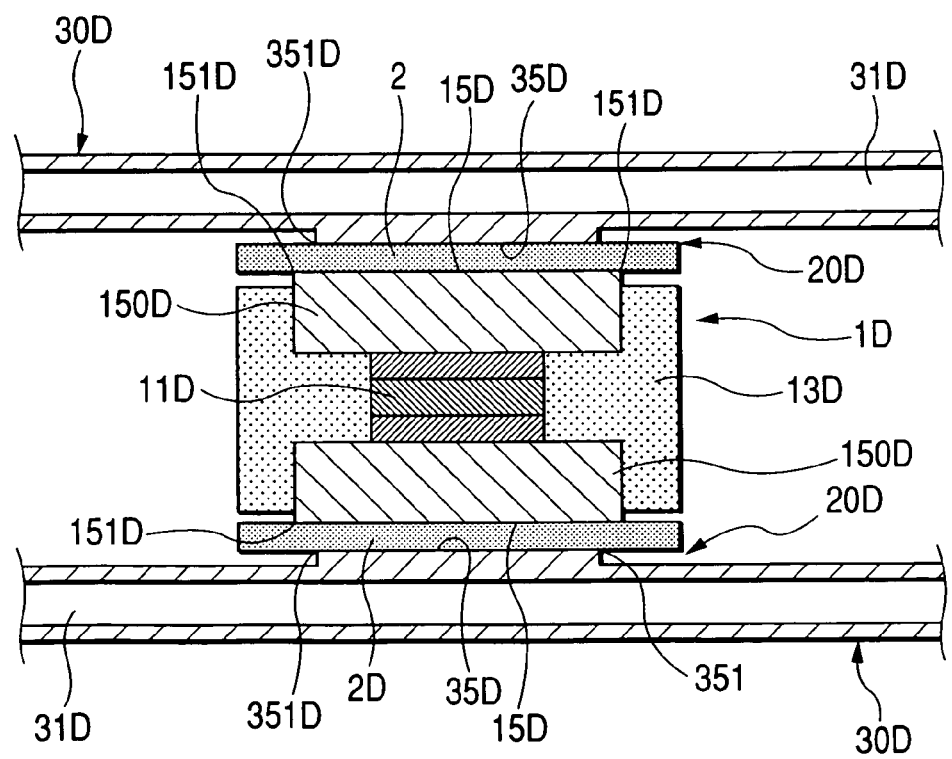
FIG. 9 is a cross-sectional view of the semiconductor insulation structure taken on line 9-9 of FIG. 7.

The semiconductor insulation structure 10D of the fifth embodiment differs from that of the first embodiment in that deformation preventing structures 20D, 20D are provided on both sides of a semiconductor module 1D. More particularly, the semiconductor modules 1D includes a pair of radiator plates 150D, 150D between which a semiconductor element 11D is sandwiched to have increased cooling efficiency. The deformation preventing structures 20D, 20D are comprised of coolers 30D, 30D, each formed with a plurality of coolant flow passageways 31D, 31D, and the radiator plates 150D, 150D. More particularly, the coolers 30D, 30D and the semiconductor module 10D are held in pressured contact with each other via insulation members 2, 2D, respectively. The coolers 30D, 30D have protruding portions 35D, 35D, each playing a role as a readily deforming abutment surface, and the radiator plates 150D, 150D have deformation resistant abutment surfaces 15D, 15D facing the readily deforming abutment surfaces 35D, 35D of the coolers 30D, 30D in areas outside outer circumferential peripheries 351D, 351D of the protruding portions 35D, 35D, respectively, as best shown in FIGS. 8 and 9.

Thus, the semiconductor insulation structure 10D of the present embodiment has combined features of the embodiments 2 to 4.

Accordingly, the present embodiment can have the same advantageous effects as those of the embodiments 2 to 4.

That is, the semiconductor module 11D has both-sided cooling capability, providing advantageous effect of improved cooling efficiency. Further, the deformation preventive structures 20D, 20D provides no area on which stress concentration takes place. This prevents damage to the insulation members 2, 2D in an effective fashion.

Sixth Embodiment

Figure 10:
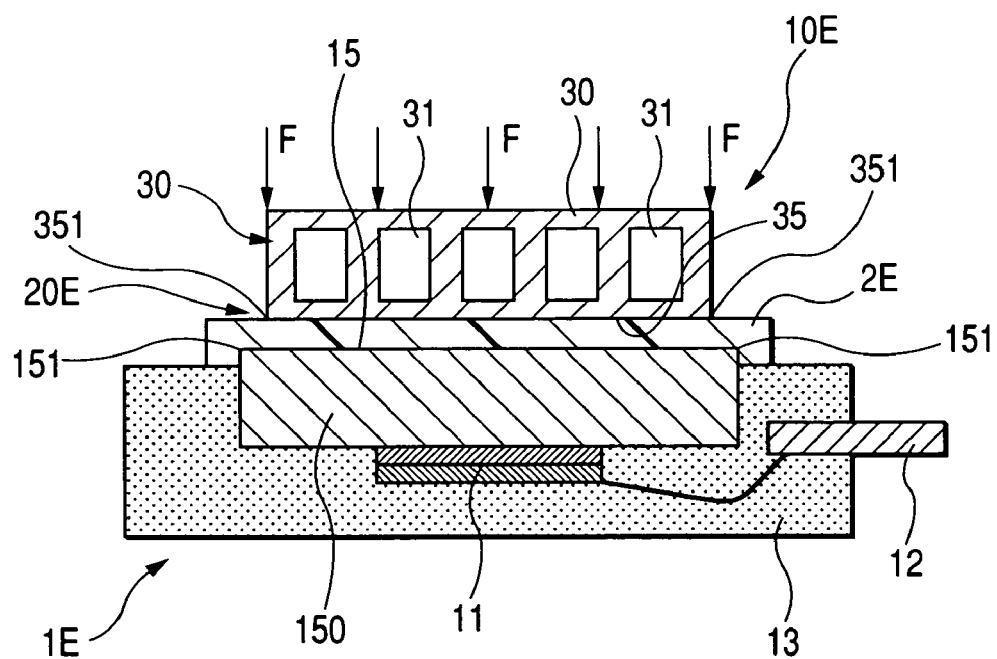
FIG. 10 is a cross-sectional view of a semiconductor insulation structure of a sixth embodiment according to the present invention.

With a semiconductor insulation structure 10E of a sixth embodiment shown in FIG. 10, an insulation member 2E is interposed between a semiconductor module 1E and a cooler 30 and comprises an insulation film placed in close contact with a deformation resistant abutment surface 15, forming part of a deformation prevention member 20E, of a radiator plate 150. The deformation prevention member 20E is also comprised of a readily deforming abutment surface 35 of the cooler 30.

The insulation film may include a resin film be made of insulation materials such as, for instance, epoxy resin, polyimide resin, silicone resin, etc. In an alternative, the insulation film may include an insulation thin film such as a carbonaceous film formed by a PVD (Physical Vapor Deposition) or a CVD (Chemical Vapor Deposition), an aluminum nitride film, a silicon nitride film, etc.

With the present embodiment, further, the cooler 3C, playing a role as an electrically conductive structural body, is formed with a plurality of coolant flow passageways 31, 31.

The semiconductor insulation structure 10E of the present embodiment is similar in other respect to that of the first embodiment.

With the present embodiment, the semiconductor insulation structure 10E can have an insulation structure that is easy to assemble. That is, the cooler 30 and the insulation member 2E are preliminarily assembled in a unitized structure, which in turn in is assembled to remaining associated component parts into the semiconductor module 1E. This provides an ease of assembling the semiconductor module 1E, the cooler 30 and the insulation member 2E.

The present embodiment has the same other advantageous effects as those of the first embodiment.

Seventh Embodiment

Figure 11:
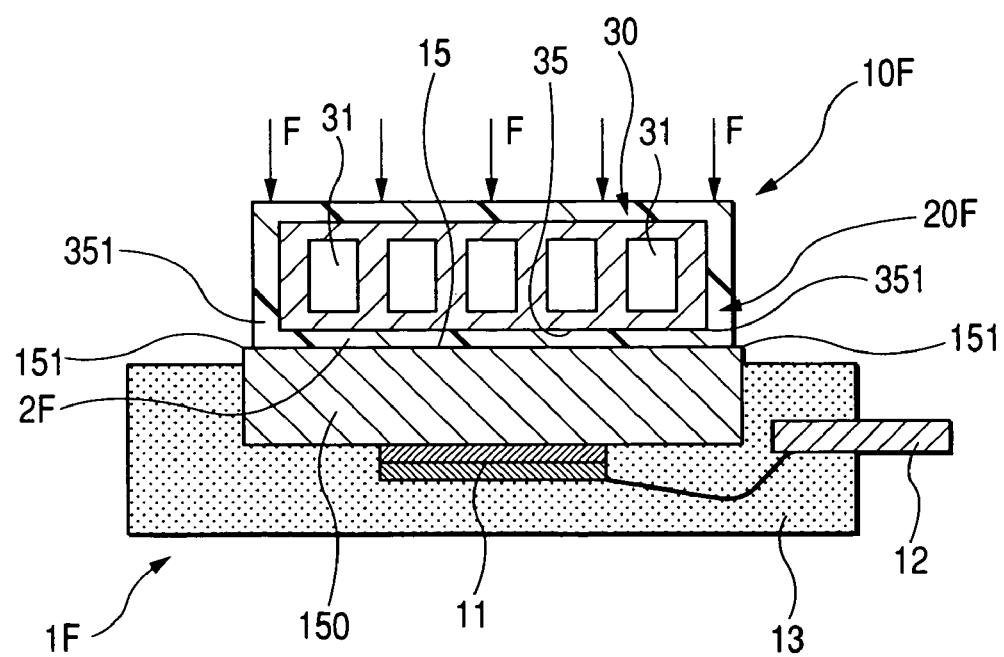
FIG. 11 is a cross-sectional view of a semiconductor insulation structure of a seventh embodiment according to the present invention.

With a semiconductor insulation structure 10F of a seventh embodiment shown in FIG. 11, an insulation member 2F, interposed between a cooler 30 and a radiator plate 150, comprises an insulation film tightly fitted to an outer peripheral surface of the cooler 30, playing a role as an electrically conductive structural body and having a readily deforming abutment surface 35 forming a part of a deformation preventing structure 20F that is also partly formed of a deformation resistant abutment surface 15 of a semiconductor module 1F. With the present embodiment, further, the insulation member 2F is formed in a configuration to surround an outer periphery of the cooler 30.

The semiconductor insulation structure 10F of the present embodiment is similar in other structure to that of the sixth embodiment mentioned above.

Like the sixth embodiment, the present embodiment can obtain a semiconductor insulation structure with improved assembling workability.

Eighth Embodiment

A semiconductor insulation structure of an eighth embodiment according to the present invention is described below with reference to FIGS. 12 and 13.

Figure 12:
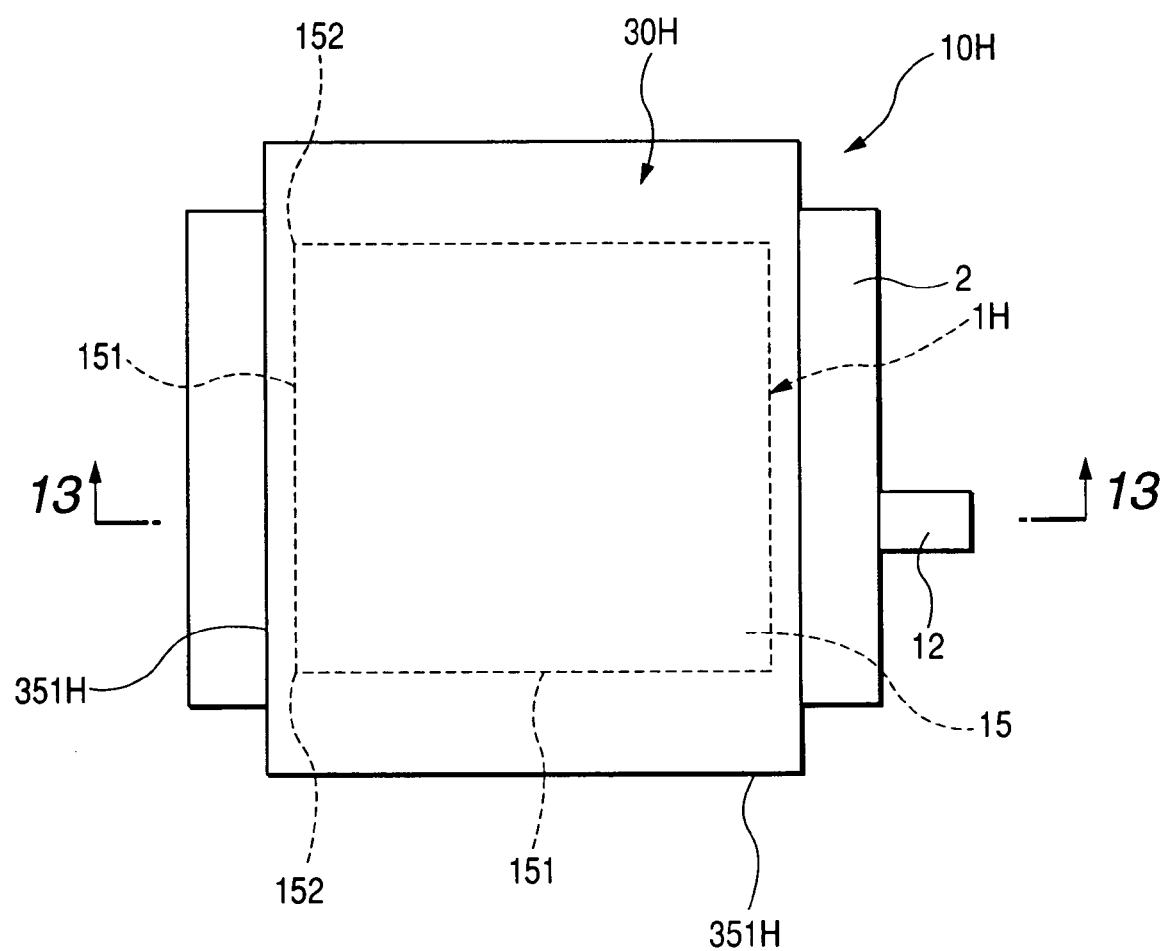
FIG. 12 is a plan view of a semiconductor insulation structure of an eighth embodiment according to the present invention.
Figure 13:
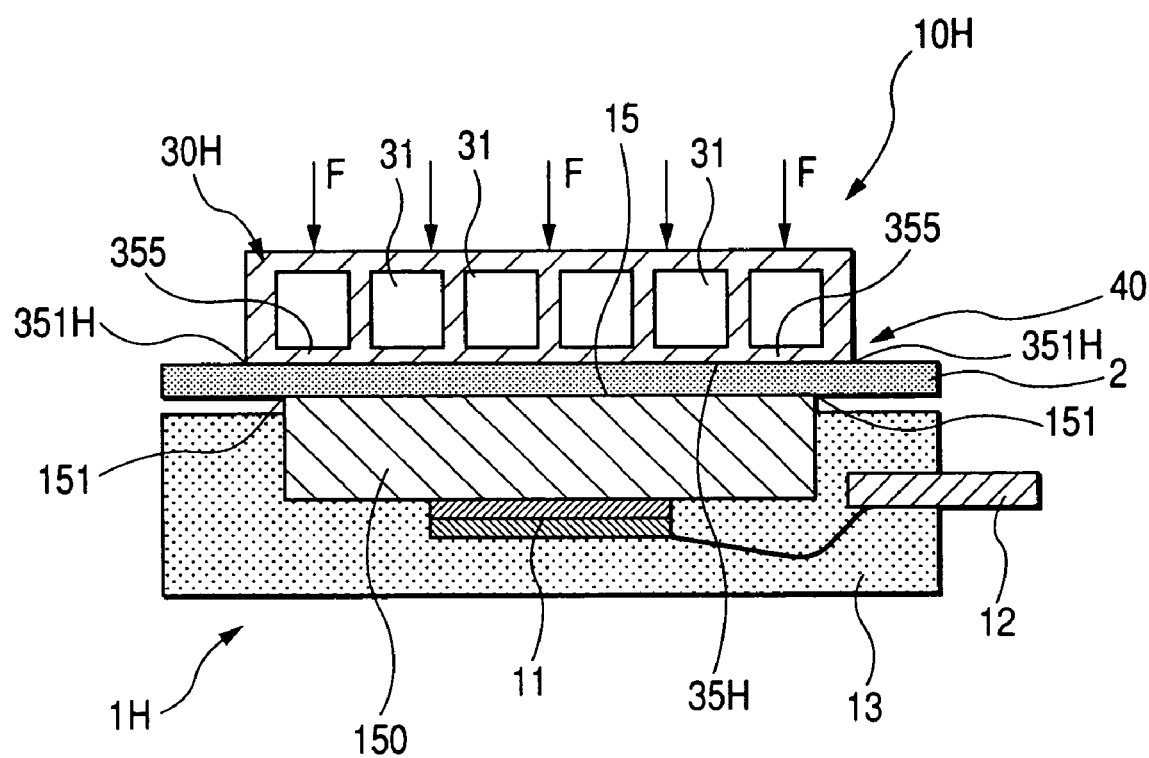
FIG. 13 is a cross-sectional view of the semiconductor insulation structure taken on line 13-13 of FIG. 12.

FIG. 12 is a plan view of the semiconductor insulation structure of the present embodiment and FIG. 13 is a cross-sectional view of the semiconductor insulation structure taken on line 13-13 in FIG. 12.

As shown in FIGS. 12 and 13, the semiconductor insulation structure 10H is comprised of a semiconductor module 1H incorporating therein a semiconductor element 11, an insulation member 2 placed in contact with the semiconductor module 1H, and a cooler 30H, placed in contact with the insulation member 2 and playing a role as an electrically conductive structural body, which sandwiches the insulation member 2 between the semiconductor module 1H and the cooler 30H in a pressured contact with each other.

As shown in FIG. 13, the semiconductor insulation structure 10H further includes a deformation preventing structure 40 associated with the cooler 30H and the semiconductor module 1H. The deformation preventing structure 40 comprises a reinforced section 355 in the form of a readily deforming abutment surface 35H of the cooler 30H facing the insulation member 2. The readily deforming abutment surface 35H is held in pressured contact with an upper surface of an insulation member 2 in opposition to a deformation resistant abutment surface 15, having an outer circumferential periphery 151, of a radiator plate 150. The reinforced section 355 has a higher Young's modulus than those of the other component parts.

In actual practice, the reinforced section 355 of the cooler 30H may take the form of a structure that includes the readily deforming abutment surface 35H whose one portion is partially made of material with a high Young's modulus or contains an additive of a component such as carbon or the like to partially provide a high Young's modulus. Also, the reinforced section 355 may be integrally formed with another part of the cooler 30H or may be separately formed from the other component parts of the cooler 30H.

Moreover, the term "another part" refers to an area of the cooler 30H, far from an outer circumferential periphery 151 of the deformation resistant abutment surface 15 of the semiconductor module 1H by a value of, for instance, 1 to 3 mm, which corresponds to an area except for a portion where stress concentration takes place in the readily deforming abutment surface 35H.

Further, as shown in FIG. 12, the deformation resistant abutment surface 15 of the semiconductor module 1H is formed in a rectangular shape. An outer circumferential periphery 151, involving all corners 152, of the deformation resistant abutment surface 15 of the semiconductor module 1H is placed outside the outer circumferential periphery 351H of the readily deforming abutment surface 35H of the cooler 30H.

Like the first embodiment, the cooler 30H is made of aluminum and the deformation resistant abutment surface 15 of the semiconductor module 1H is made of copper.

The semiconductor insulation structure 10H of the present embodiment has the same structure in other respect as that of the first embodiment and, hence, a detailed description of the same parts is herein omitted.

Now, the operation of the semiconductor insulation structure 10H is described below in detail.

The abutment surface 35H of the cooler 30H has an area, placed on the insulation member 2 in opposition to the outer circumferential periphery of the deformation resistant abutment surface 15 of the semiconductor module 1H, which includes the reinforcement 355 having the higher Young's modulus than that of another area. That is, of the readily deforming abutment surface 35H of the cooler 30H, an area liable to suffer from stress concentration is comprised of the reinforcement 355. This results in capability of preventing the readily deforming abutment surface 35H of the cooler 30H from being deformed to prevent a bending force to act on the insulation member 2, thereby enabling the prevention of damage to the insulation member 2. This results in capability of avoiding a drop in electrically insulating property between the semiconductor module 1H and the cooler 30H.

As set forth above, the present embodiment can provide a semiconductor insulation structure that can prevent damage to an insulation member for thereby adequately preventing a drop in electrically insulating property between a semiconductor module and a cooler.

Moreover, while with the semiconductor insulation structure 10H of the present embodiment has been described above with reference to the reinforcement 355 that has improved Young's modulus by which the deformation of the readily deforming abutment surface 35H is prevented, the reinforcement 355 may have improved tension strength, yield stress or rigidity by which the deformation is prevented.

That is, for instance, the reinforcement 355 may have a partial area that is altered to material with increased tension strength or added with constituent such as carbon or the like for thereby providing increased tension strength. In such a case, using the reinforcement 355 under a status where a force acts on the reinforcement within a plastic zone enables the prevention of damage to the readily deforming abutment surface 35H of the cooler 30H.

Further, description is made of improvement in rigidity of the reinforcement 355 with reference to ninth to fourteenth embodiments.

Ninth Embodiment

Figure 14:
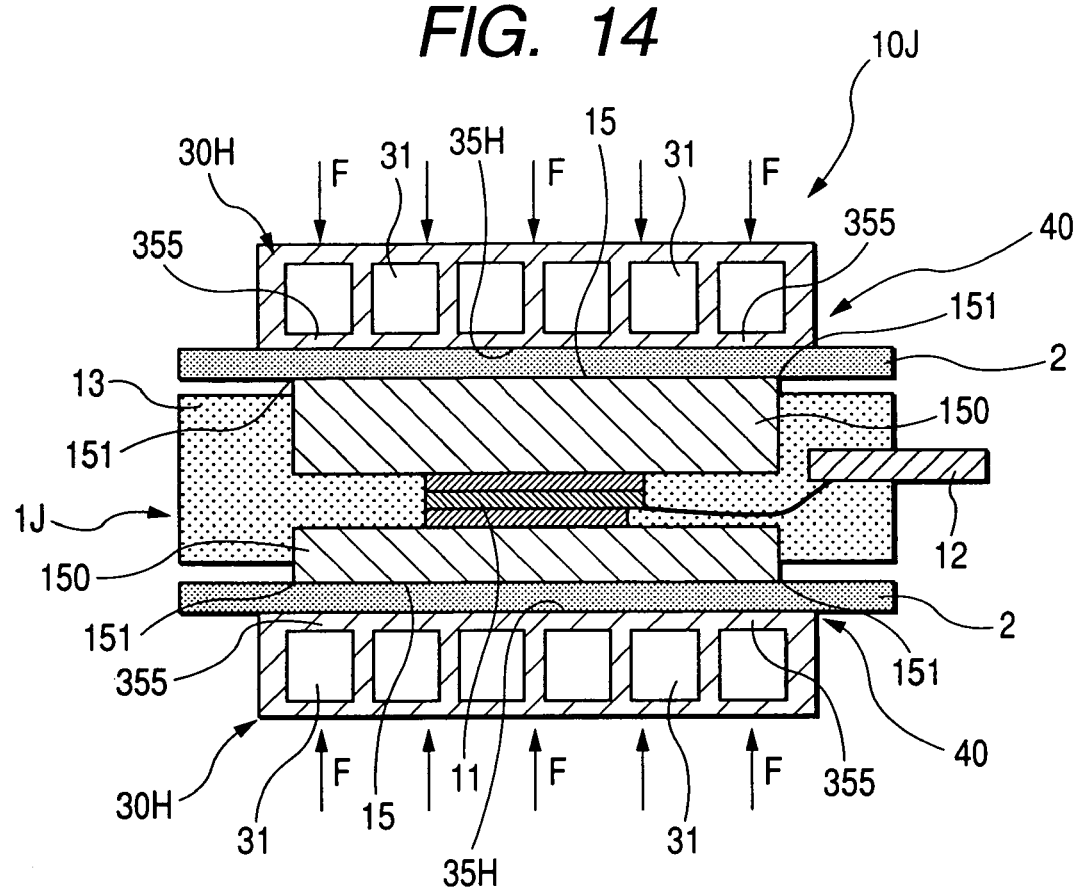
FIG. 14 is a cross-sectional view of a semiconductor insulation structure of a ninth embodiment according to the present invention.

A semiconductor insulation structure 10J of a ninth embodiment is described with reference to FIG. 14.

The semiconductor insulation structure 10J of the present embodiment has the same structure as that of the eighth embodiment except for the semiconductor insulation structure 10J wherein the coolers 30H, 30H, each of which has the reinforcement forming the deformation preventing structure 40, are held in pressured contact with the semiconductor module 1J on both side thereof via the insulation members 2, 2, respectively.

More particularly, the semiconductor module 1J takes the form of a semiconductor module of a both-sided cooling type and includes radiator plates 150, 150 between which a semiconductor element 11 is sandwiched. Also, the coolers 30H, 30H are held in pressured contact with the deformation resistant abutment surfaces 15, 15 of the radiator plates 150, 150 via the insulation members 2, 2, respectively.

With the semiconductor insulation structure 10J of the present embodiment, the semiconductor insulation structure 10J has the both sides that are cooled with the coolers 30H, resulting in increased cooling efficiency of the semiconductor insulation structure 10J.

Additionally, the semiconductor insulation structure 10J of the present embodiment has the same advantageous effects as that of the eighth embodiment.

Tenth Embodiment

Figure 15:
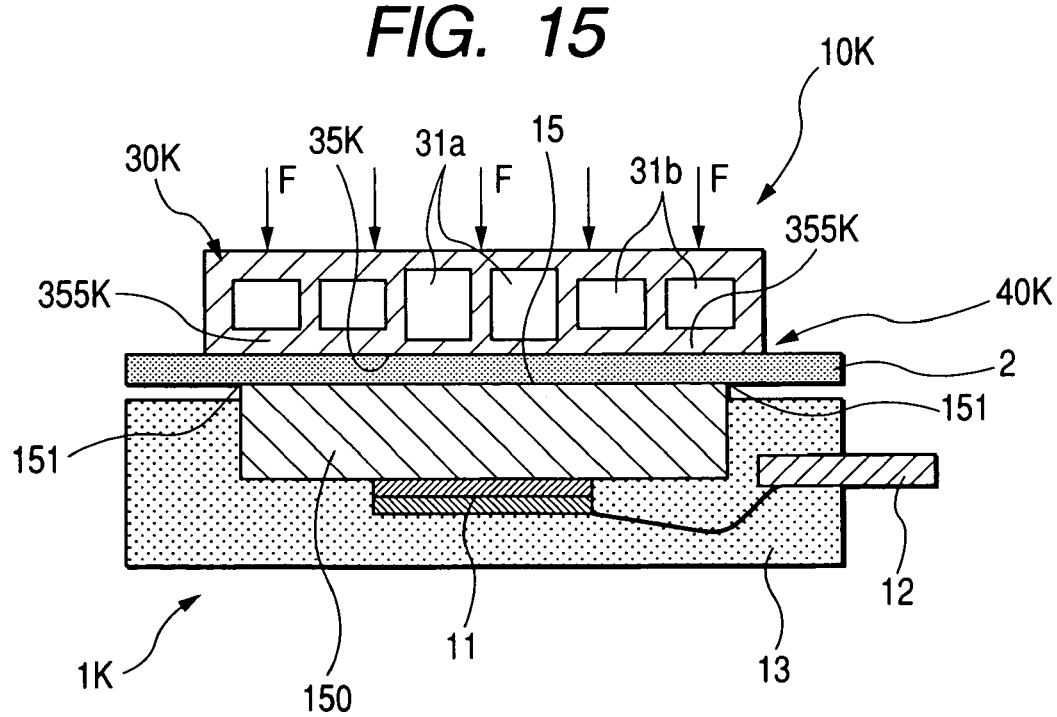
FIG. 15 is a cross-sectional view of a semiconductor insulation structure of a tenth embodiment according to the present invention.

A semiconductor insulation structure 10K of a tenth embodiment is described below with reference to FIG. 15.

The semiconductor insulation structure 10K of the present embodiment has the same structure as that of the eighth embodiment except for the semiconductor insulation structure 10K that includes a cooler 30K formed with a reinforcement 355K placed on an area corresponding to the outer circumferential area 151 of the deformation resistant abutment surface 15 of the semiconductor module 1K and playing a role as a deformation preventing structure 40K.

In particular, the cooler 30K has a central area formed with first coolant flow passageways 31a and outer peripheral areas formed with second coolant flow passageways 31b each with a cross-sectional surface area smaller than those of the first coolant flow passageway 31. These coolant flow passageways 31a, 31b are formed so as to provide the reinforcement 355K with a larger thickness than that of the other area of the cooler 30K so as to provide the deformation preventing structure 40K.

With such a structure, the reinforcement 355K has higher rigidity than that of the other area. That is, the reinforcement 355K of the cooler 30K undergoes a less degree of deformation even when applied with an increased pressing force.

In addition, the semiconductor insulation structure 10K of the present embodiment has the same advantageous effects as those of the eighth embodiment.

With the semiconductor insulation structure 10K of the present embodiment, an area, susceptible to undergo stress concentration, of the readily deforming abutment surface 35K of the cooler 30K includes the deformation preventing structure 40K composed of the reinforcement 355K with increased rigidity. Therefore, the reinforcement 355K is effective to prevent the occurrence of deformation of the readily deforming abutment surface 35K of the cooler 30K. This results in capability of precluding a bending force from acting on the insulation member 2, thereby avoiding the occurrence of damage to the insulation member 2. As a result, this enables the prevention of a drop in electrically insulating property between the semiconductor module 1K and the cooler 30K.

As set forth above, even with the present embodiment, the reinforcement 355K with increased rigidity enables the prevention of the occurrence of damage to the insulation member 2 for thereby precluding the occurrence of deterioration in electrically insulating property between the semiconductor module 1K and the cooler 30K. Additionally, the semiconductor insulation structure 10K of the present embodiment has the same other advantageous effects as those of the eighth embodiment.

Eleventh Embodiment

Figure 16:
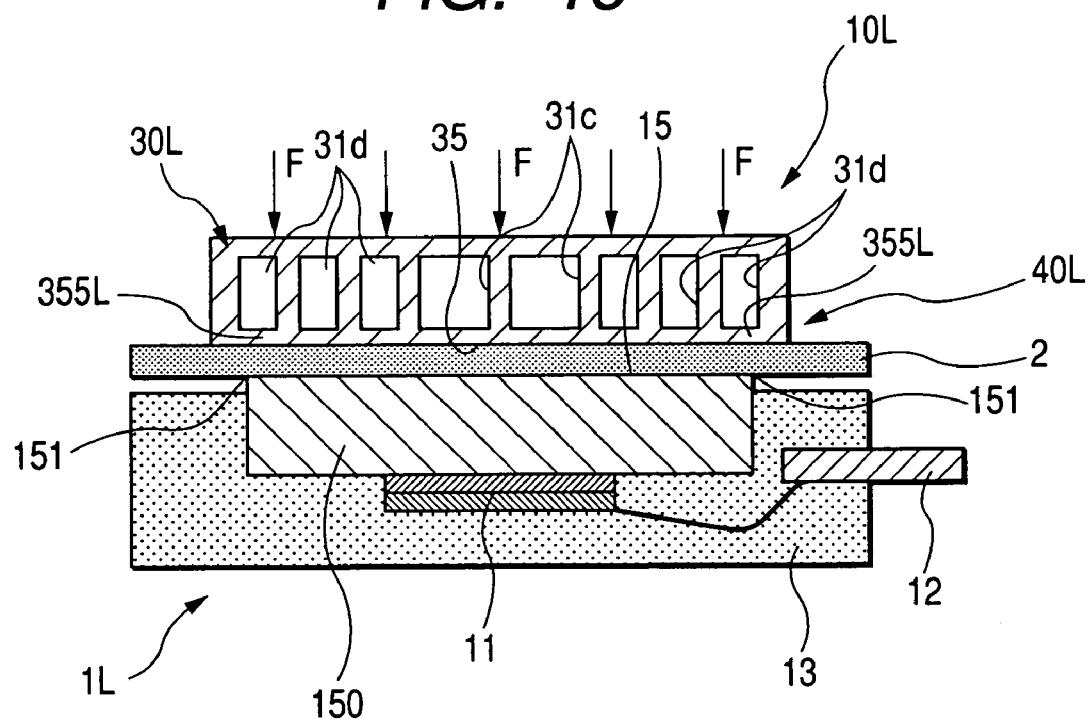
FIG. 16 is a cross-sectional view of a semiconductor insulation structure of an eleventh embodiment according to the present invention.

A semiconductor insulation structure 10L of an eleventh embodiment is described below with reference to FIG. 16.

The semiconductor insulation structure 10L of the present embodiment differs from that of the tenth embodiment in that the semiconductor insulation structure 10L includes a cooler 30L includes a deformation preventing structure 40L composed of a reinforcement 355L placed on an area corresponding to the outer circumferential area 151 of the deformation resistant abutment surface 15 of a semiconductor module 1L. In particular, the cooler 30L has a central area formed with first coolant flow passageways 31c and outer peripheral areas formed with second coolant flow passageways 31d each with a cross-sectional surface area smaller than that of the first coolant flow passageway 31c. That is, each of the second coolant flow passageways 31d has a narrow lateral width than that of each of the first coolant flow passageways 31c to provide the reinforcement 355L with increased rigidity.

The semiconductor insulation structure 10L of the present embodiment has the same other structure in other respect as that of the tenth embodiment.

Even with the present embodiment, the semiconductor insulation structure 10L has capability of effectively forming the reinforcement 355L with higher rigidity than that of the other area of the cooler 30L.

That is, if the second flow passageways 31d have large lateral width, internal cavities of the cooler 30L increase in side areas and rigidity of the reinforcement 355L is liable to decrease. To avoid such an issue, the reinforcement 355L of the cooler 30L is formed of the flow passageways each with the decreased lateral width, thereby providing the reinforcement 355L with increased rigidity.

The semiconductor insulation structure 10L of the present embodiment has the same other advantageous effects as those of the tenth embodiment.

Twelfth Embodiment

Figure 17:
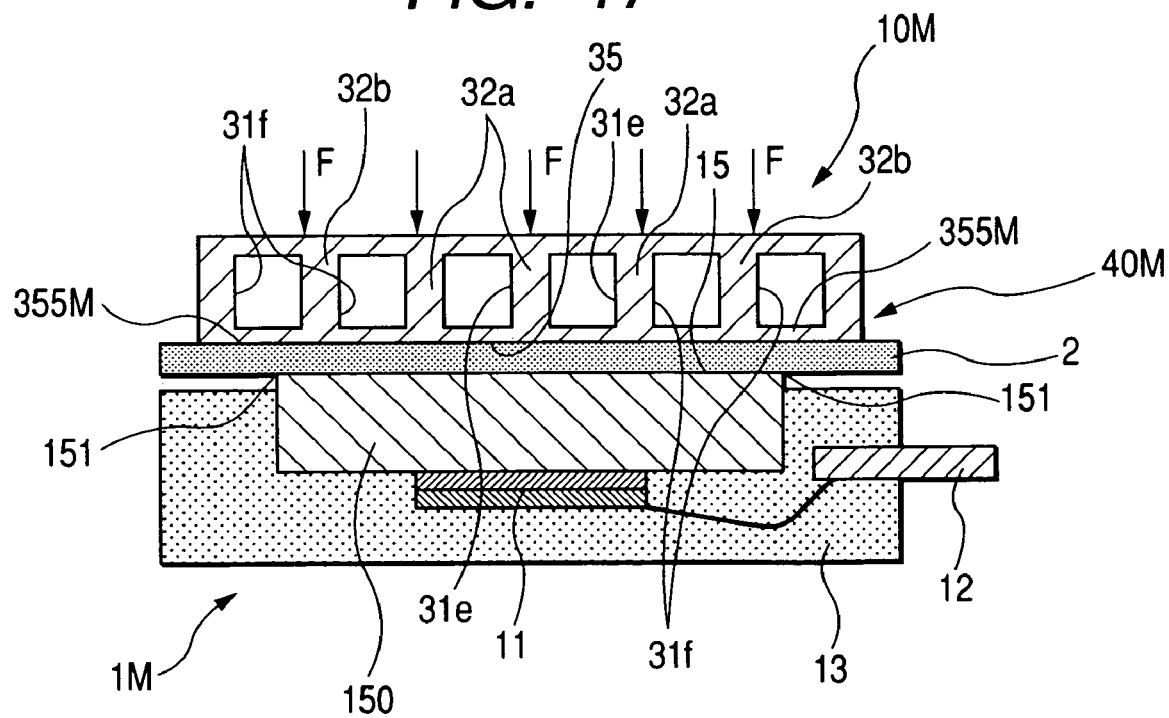
FIG. 17 is a cross-sectional view of a semiconductor insulation structure of a twelfth embodiment according to the present invention.

A semiconductor insulation structure 10M of a twelfth embodiment is described below with reference to FIG. 17.

The semiconductor insulation structure 10M of the present embodiment differs from that of the tenth embodiment in that the semiconductor insulation structure 10M includes a cooler 30M having a deformation preventing structure 40M formed of a reinforcement 355M placed on a deformation resistant abutment surface 15 of a semiconductor module 1M. In particular, the cooler 30M has a central area formed with formed with a plurality of coolant flow passageways 31e with first vertically extending partition walls 32a and outside peripheral areas formed with a plurality of coolant flow passageways 31f formed with second vertically extending partition walls 32b each having a larger wall thickness than that of each of the first partition walls 32a to provide the reinforcement 355M with increased rigidity as the deformation preventing structure 40M.

The semiconductor insulation structure 10M of the present embodiment has the same other structure as that of the tenth embodiment.

With such a structure, increasing the thickness of the second partition walls 32b allows the reinforcement 355M to have increased rigidity so as to withstand a pressing force applied to the cooler 30M when assembled onto the semiconductor module 1M.

The semiconductor insulation structure 10M of the present embodiment has the same advantageous effects as those of the tenth embodiment.

Thirteenth Embodiment

Figure 18:
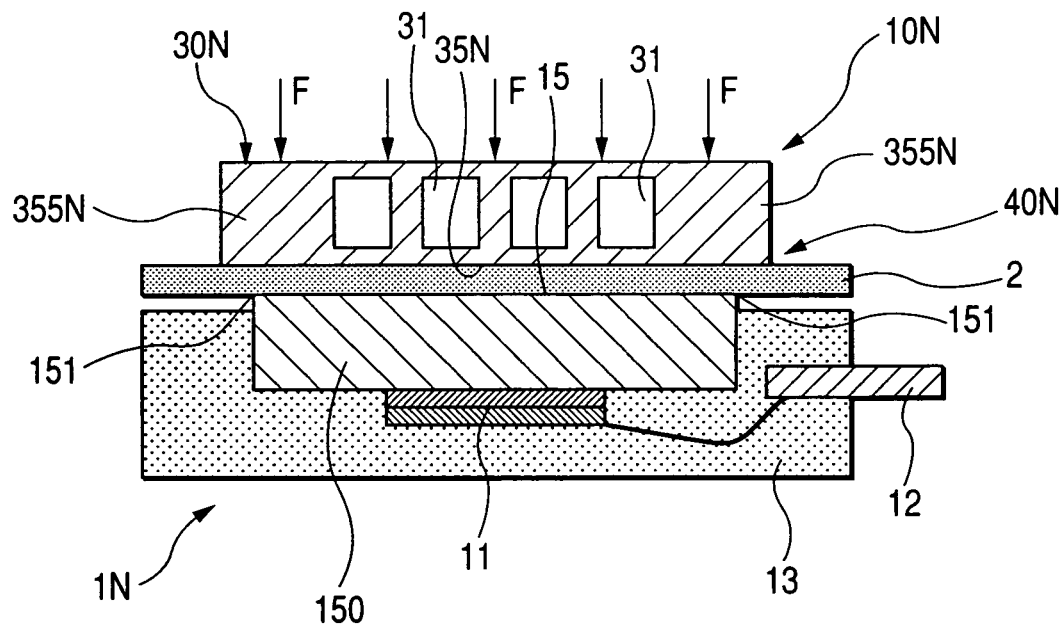
FIG. 18 is a cross-sectional view of a semiconductor insulation structure of a thirteenth embodiment according to the present invention.

A semiconductor insulation structure 10N of a thirteenth embodiment is described below with reference to FIG. 18.

The semiconductor insulation structure 10N of the present embodiment differs from that of the tenth embodiment in that the semiconductor insulation structure 10N includes a cooler 30N having a central area formed with a plurality of coolant flow passageways 31 and a sided area surrounding the central area and formed with a reinforcement 355N. The reinforcement 355N is solid in structure and plays as a role as a deformation preventing structure 40N with increased rigidity. The reinforcement 355N has a readily deforming abutment surface 35 placed on a deformation resistant abutment surface 15 of a semiconductor module IN with an intervening insulation member 2.

The semiconductor insulation structure 10N of the present embodiment has the same other structure as that of the tenth embodiment.

With such a structure, allowing the coolant medium flow passageways 31, causing a reduction in rigidity, to be formed in the central area of the cooler 30N remote from the reinforcement 355N provides capability of easily ensuring the reinforcement 355N with increased rigidity so as to withstand a pressing force applied to the cooler 30N when assembled onto the semiconductor module 1N.

The semiconductor insulation structure 10N of the present embodiment has the same advantageous effects as those of the tenth embodiment.

Fourteenth Embodiment

Figure 19:
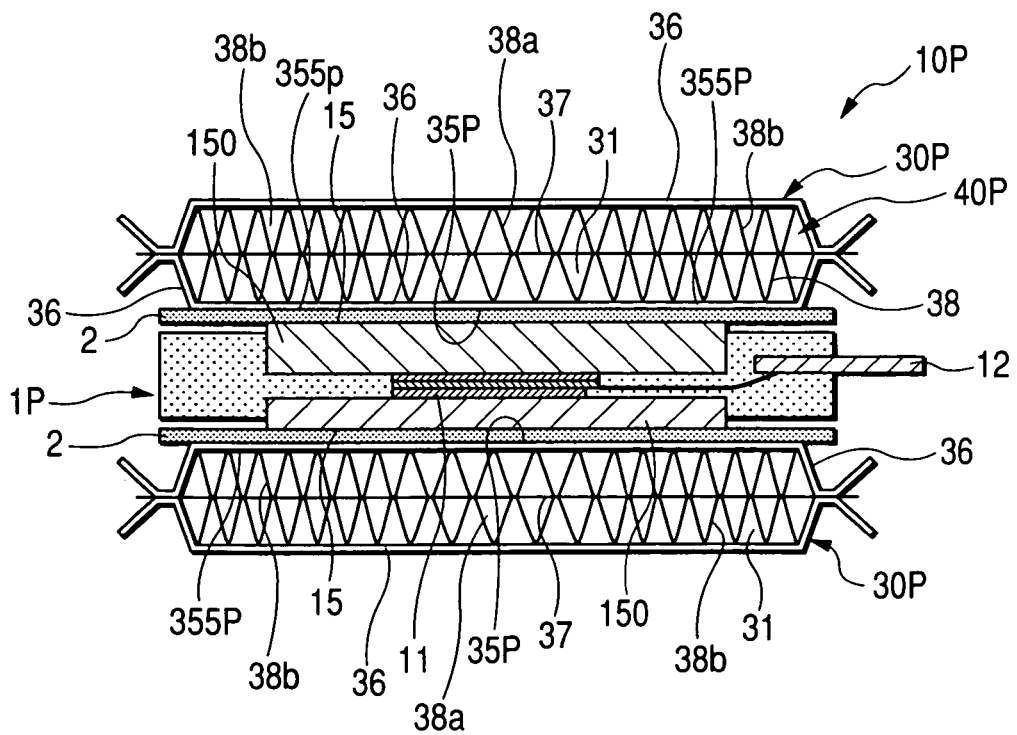
FIG. 19 is a cross-sectional view of a semiconductor insulation structure of a fourteenth embodiment according to the present invention.

A semiconductor insulation structure 10P of a fourteenth embodiment is described below with reference to FIG. 19.

The semiconductor insulation structure 10P of the present embodiment differs from that of the tenth embodiment in that the semiconductor insulation structure 10P includes first and second coolers 30P, each of which includes a drawn-cup type evaporator (laminated-type evaporator).

More particularly, the cooler 30P is comprised of first and second outer shell plates 36a, 36b, an intermediate plate 37 extending between the pair of outer shell plates 36a, 36b, and first and second corrugated inner fins 38 each disposed between one of the outer shell plates 36a, 36b and the intermediate plate 37. Thus, each of the first and second corrugated inner fins 38 forms a plurality of coolant medium flow passageways 31.

With the structure mentioned above, the cooler 30P has a central area formed with a coarsely corrugated section 38a with low corrugation density, and sided areas formed with a densely corrugated section 38b with high corrugation density. Thus, the densely corrugated sections 38b have narrow pitches in corrugation to provide reinforcements 355P playing a role as deformation preventing structures 40P each with increased rigidity. Thus, the deformation preventing structures 40P are held in pressured contact with deformation resistant abutment surfaces 15 of a semiconductor module 1P with intervening insulation members 2.

The semiconductor insulation structure 10P of the present embodiment has the same other structure as that of the tenth embodiment.

With such a structure, decreasing a pitch size of the corrugated inner fins at the sided areas thereof enables the provision of the cooler 30P to have the deformation preventing structures 40P, composed of the respective reinforcements 355P, with increased rigidity. This provides capability of easily ensuring the reinforcements 355P with increased rigidity so as to withstand a pressing force applied to the cooler 30P when assembled onto the semiconductor module 1P.

The semiconductor insulation structure 10P of the present embodiment has the same advantageous effects as those of the tenth embodiment.

Fifteenth Embodiment

Figure 20:
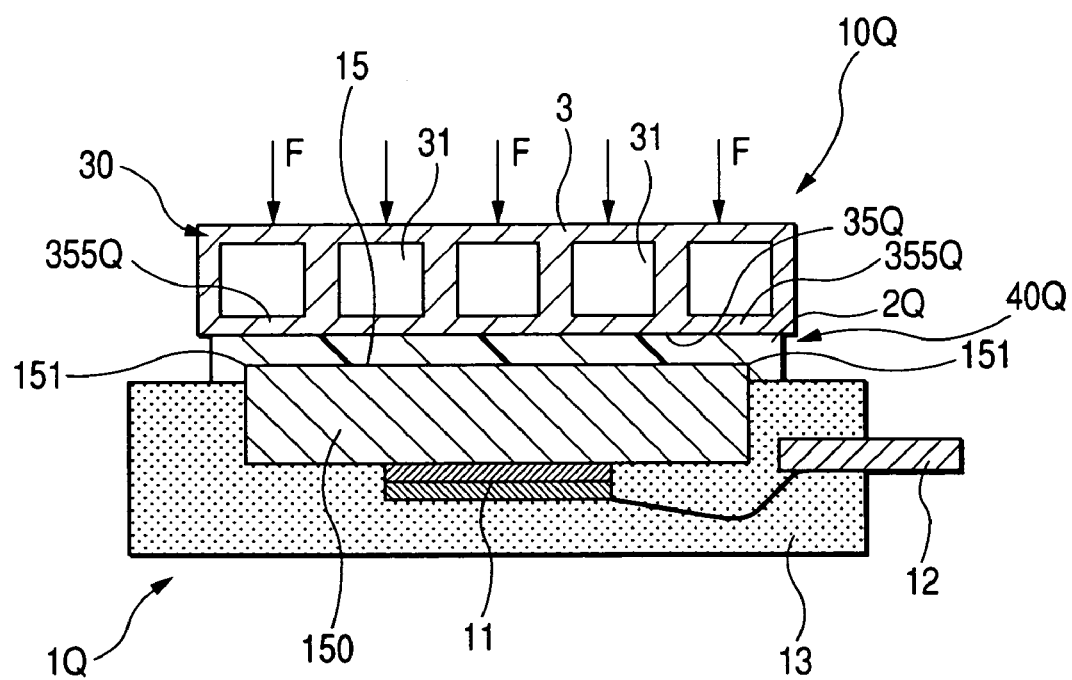
FIG. 20 is a cross-sectional view of a semiconductor insulation structure of a fifteenth embodiment according to the present invention.

A semiconductor insulation structure 10Q of a fifteenth embodiment is described below with reference to FIG. 20.

With the semiconductor insulation structure 10Q of the present embodiment, an insulation member 2Q is interposed between the radiator plate 150 and the cooler 30 and comprises an insulation film placed in close contact with the deformation resistant abutment surface 15 of a radiator plate 150.

The insulation film includes a resin film made of insulation materials such as, for instance, epoxy resin, polyimide resin, silicone resin, etc. In an alternative, the insulation film may include an insulation thin film such as a carbonaceous film formed by a PVD (Physical Vapor Deposition) or a CVD (Chemical Vapor Deposition), an aluminum nitride film, a silicon nitride film, etc.

With such a structure, the cooler 30 includes a reinforcement 355Q playing a role as a deformation preventing structure 40Q.

The semiconductor insulation structure 10Q of the present embodiment has the same other structure as that of the tenth embodiment.

The present embodiment makes it possible to obtain a semiconductor insulation structure that has improved assembling workability. That is, the cooler 30 and the insulation member 2Q are preliminarily assembled in a unitized structure, which in turn in is assembled to other associated component parts into the semiconductor module 1Q. This provides an ease of assembling the semiconductor module 1Q, the cooler 30 and the insulation member 2Q.

The semiconductor insulation structure 10Q of the present embodiment has the same advantageous effects as those of the tenth embodiment.

Sixteenth Embodiment

Figure 21:
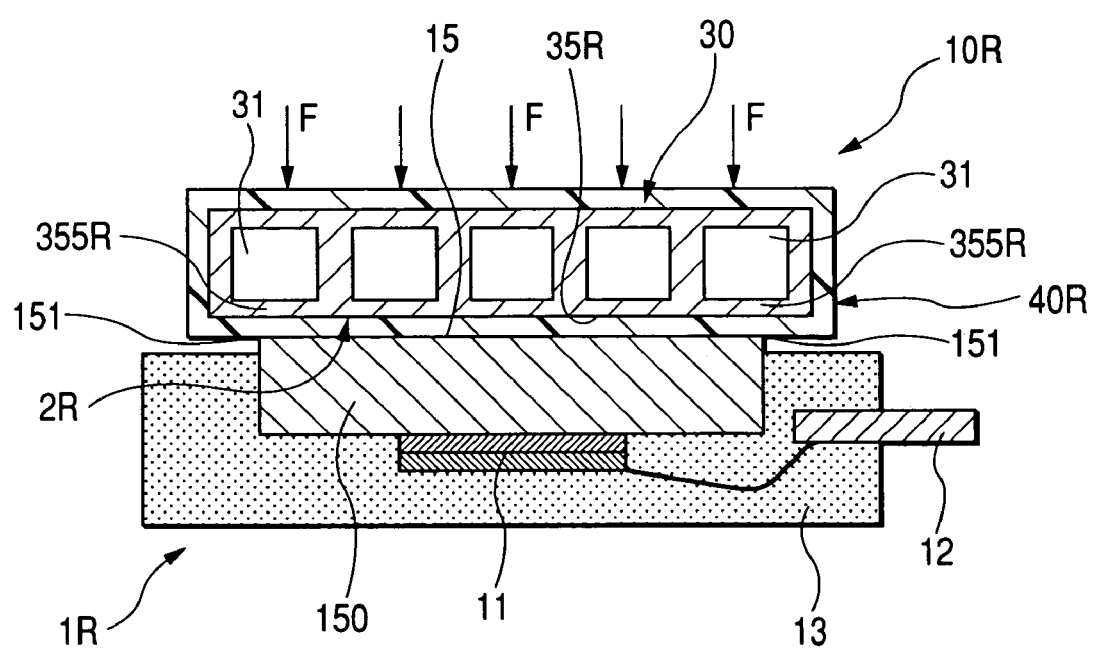
FIG. 21 is a cross-sectional view of a semiconductor insulation structure of a sixteenth embodiment according to the present invention.
Figure 22:
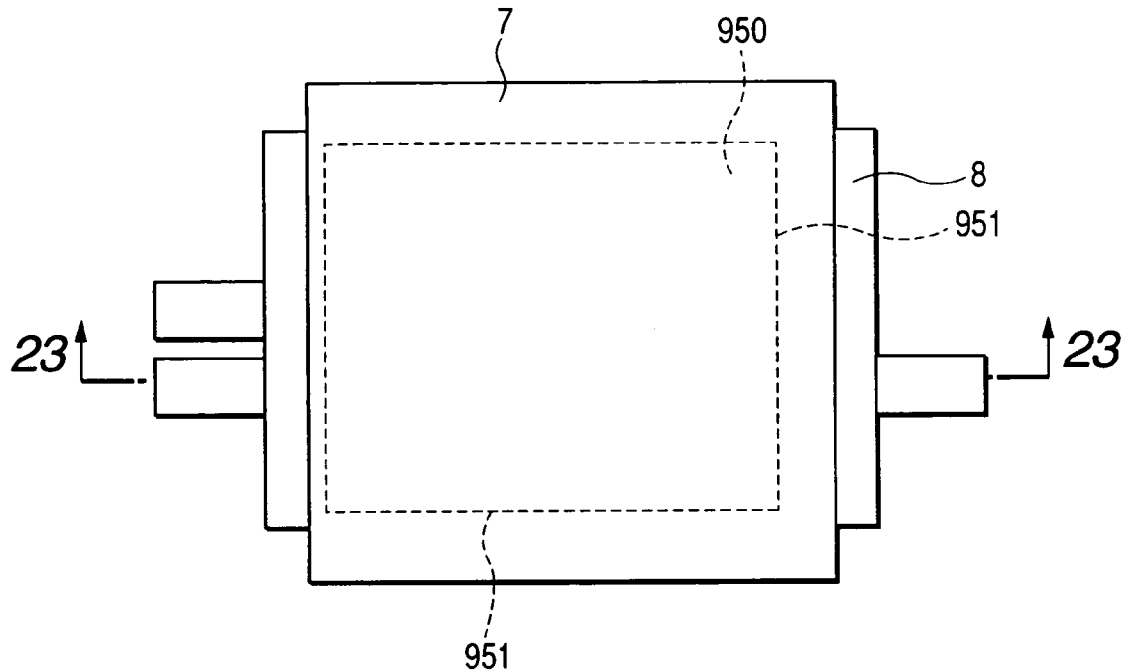
FIG. 22 is a plan view of a semiconductor insulation structure of the related art.
Figure 23:
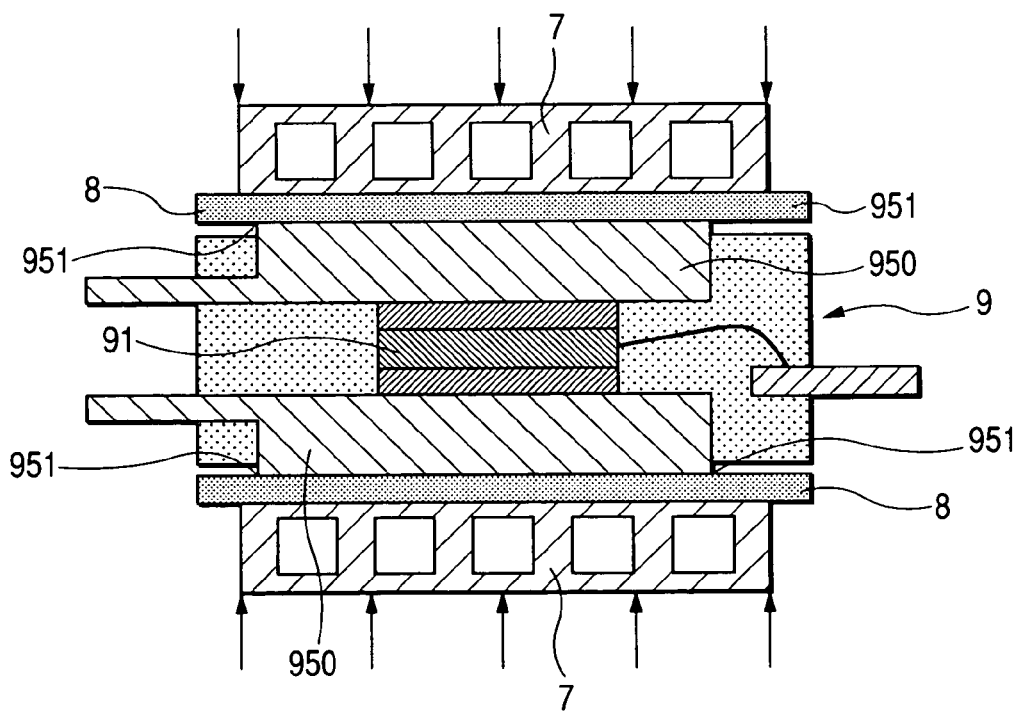
FIG. 23 is a cross-sectional view of the semiconductor insulation structure taken on line 23-23 of FIG. 22.

A semiconductor insulation structure 10R of a sixteenth embodiment is described below with reference to FIG. 21.

With the semiconductor insulation structure 10R of the present embodiment, an insulation member 2R, interposed between the cooler 30 and a radiator plate 150, comprises an insulation film tightly fitted to an overall peripheral surface of the cooler 30. The cooler 30 includes a reinforcement 355R playing a role as a deformation preventing structure 40R.

With the present embodiment, further, the insulation member 2R is formed in a configuration to surround an entire periphery of the cooler 30.

The semiconductor insulation structure 10R of the present embodiment is similar in other structure to that of the tenth embodiment mentioned above.

Like the fifteenth embodiment, the present embodiment can obtain a semiconductor insulation structure with improved assembling workability.

While the present invention has been set forth above with reference to the exemplary cases employing the semiconductor insulation structure on which the cooler or coolers, playing a role as the electrically conductive structural body and formed with the coolant flow passageways, are mounted, the electrically conductive structural body may be replaced with another structural body such as, for instance, a heat sink, case, another electronic component, etc.

Moreover, although the various embodiments have been described above with reference to the exemplary structures wherein the deformation resistant abutment member is made of copper and the readily deformable member is made of aluminum, the present invention is not limited to these materials and various other materials may be employed for these component parts provided that the deformation resistant abutment member is made of material that provides a less deformation rate than that of the readily deformable member.

While the present invention has been described in detail, it will be appreciated by those skilled in the art that various modifications and alternatives to details of the present invention could be developed in light of the overall teachings of the disclosure. Accordingly, the particular arrangements disclosed are meant to be illustrative only and not limited to the scope of the present invention, which is to be given the full breadth of the following claims and all equivalents thereof.

What is claimed is:

1. A semiconductor insulation structure comprising:
   a semiconductor module incorporating therein a semiconductor element and having one surface serving as a first abutment surface;

an insulation member having one surface held in contact with the first abutment surface of the semiconductor module; and an electrically conductive structural body having a second abutment surface held in contact with the other surface of the insulation member so as to sandwich the same between the electrically conductive structural body and the semiconductor module, wherein the semiconductor module, the insulation member and the electrically conductive structural body are held in a pressured contact with each other;

wherein one of the first and second abutment surfaces is made of a material to provide a deformation resistant abutment surface with a less deformation rate in terms of a given load and the other one of the first and second abutment surfaces is made of a material to provide a readily deforming abutment surface with a greater deformation rate in terms of the given load than that of the one of the first and second abutment surfaces; and wherein at least a portion of an outer circumferential periphery of the deformation resistant abutment surface is placed outside an outer circumferential periphery of the readily deforming abutment surface.

2. The semiconductor insulation structure according to claim 1, wherein:

the deformation resistant abutment surface has corners all of which are placed outside the outer circumferential periphery of the readily deforming abutment surface.

3. The semiconductor insulation structure according to claim 1, wherein:

the deformation resistant abutment surface has an outer circumferential periphery a part of which is placed outside the outer circumferential periphery of the readily deforming abutment surface.

4. The semiconductor insulation structure according to claim 1, wherein:

the electrically conductive structural body comprises a cooler for cooling the semiconductor module.

\* \* \* \* \*

UNITED STATES PATENT AND TRADEMARK OFFICE
CERTIFICATE OF CORRECTION

PATENT NO. : 7,508,067 B2
APPLICATION NO. : 11/546976
DATED : March 24, 2009
INVENTOR(S) : Hiroaki Arai et al.

It is certified that error appears in the above-identified patent and that said Letters Patent is hereby corrected as shown below:

Title page, item "(75) Inventors: Hiroaki Arai, Nagoya (JP); Takahiro Ogawa, Aichi-ken (JP); Mitsuhara Inagaki, Nishio (JP)" should be:

--(75) Inventors: Hiroaki Arai, Nagoya (JP); Takahiro Ogawa, Aichi-ken (JP); Mitsuharu Inagaki, Nishio (JP)--

Signed and Sealed this

Twelfth Day of May, 2009

JOHN DOLL
*Acting Director of the United States Patent and Trademark Office*